United States Patent
Ravi et al.

(10) Patent No.: US 10,389,151 B2
(45) Date of Patent: Aug. 20, 2019

(54) METHOD FOR FAST CHARGING LITHIUM-ION BATTERIES

(71) Applicant: Robert Bosch GmbH, Stuttgart (DE)

(72) Inventors: Nikhil Ravi, Redwood City, CA (US); Anantharaman Subbaraman, Mountain View, CA (US); Reinhardt Klein, Mountain View, CA (US); Ashish Krupadanam, Cupertino, CA (US); Anahita MirTabatabaei, San Francisco, CA (US); Gerd Simon Schmidt, Cupertino, CA (US); Christoph Klee, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 44 days.

(21) Appl. No.: 15/727,893

(22) Filed: Oct. 9, 2017

(65) Prior Publication Data

US 2018/0145527 A1    May 24, 2018

Related U.S. Application Data

(63) Continuation-in-part of application No. 15/626,553, filed on Jun. 19, 2017, now Pat. No. 10,291,046.

(60) Provisional application No. 62/425,683, filed on Nov. 23, 2016.

(51) Int. Cl.
*H02J 7/04* (2006.01)
*H02J 7/00* (2006.01)
*G01R 31/3842* (2019.01)

(52) U.S. Cl.
CPC ........ *H02J 7/0057* (2013.01); *G01R 31/3842* (2019.01); *H02J 7/007* (2013.01); *H02J 7/0045* (2013.01); *H02J 7/0083* (2013.01); *H02J 2007/0096* (2013.01)

(58) Field of Classification Search
USPC ........................................................ 320/162
See application file for complete search history.

(56) References Cited

U.S. PATENT DOCUMENTS 6,040,684 A    3/2000  Mitchell
9,153,991 B2   10/2015 Chaturvedi et al.
(Continued)

FOREIGN PATENT DOCUMENTS

GB    2528350 A    4/2015

*Primary Examiner* — Arun C Williams
(74) *Attorney, Agent, or Firm* — Maginot Moore & Beck LLP

(57) ABSTRACT

A method for charging a battery comprises: measuring a battery voltage with a voltage sensor and a battery current with a current sensor; applying, with a charging circuit, a first charging current to the battery until the measured battery voltage exceeds a predetermined voltage threshold, a magnitude of the first charging current being held at a first constant value; applying, with the charging circuit, in response to the measured battery voltage exceeding the predetermined voltage threshold, a second charging current to the battery until a cutoff criterion is satisfied, a magnitude of the second charging current being such that the battery voltage exceeds a steady state voltage limit for the battery; after the cutoff criterion is satisfied, determining a rest voltage of the battery; and updating the cutoff criterion based on a difference between the determined rest voltage and a target rest voltage.

18 Claims, 15 Drawing Sheets

(56) References Cited

U.S. PATENT DOCUMENTS

| | | | |
|---|---|---|---|
| 2004/0145487 A1* | 7/2004 | Wendelrup | H02J 7/0004 340/636.1 |
| 2008/0185998 A1* | 8/2008 | Starodubtsev | H01G 9/155 320/166 |
| 2009/0259420 A1 | 10/2009 | Greening et al. | |
| 2014/0002031 A1 | 1/2014 | Chaturvedi et al. | |
| 2017/0104359 A1* | 4/2017 | Jung | H02J 7/025 |

* cited by examiner

METHOD FOR FAST CHARGING LITHIUM-ION BATTERIES

This application is a continuation-in-part application of U.S. patent application Ser. No. 15/626,553, filed on Jun. 19, 2017, which claims the benefit of priority of U.S. provisional application Ser. No. 62/425,683, filed on Nov. 23, 2016. This application also claims the benefit of priority to the U.S. provisional application Ser. No. 62/425,683, filed on Nov. 23, 2016. The complete subject matters of the above-mentioned patent applications are hereby incorporated herein by reference, in their entireties.

FIELD

The method and system disclosed in this document relate to charging of batteries and, more particularly, to fast charging of lithium-ion batteries.

BACKGROUND

Batteries are electrochemical energy storage devices that convert chemical energy intro electrical energy. One particular type of battery is a lithium-ion (Li-ion) battery. Lithium-ion batteries are desirable energy storage devices for portable electronics and electric and hybrid-electric vehicles, among other devices and systems, because they have a high specific energy compared to other electrochemical energy storage devices.

A key requirement for widespread adoption of battery technologies is providing a quick charging time, without hastening degradation of usable capacity. State of the art charging systems employ some variation of a constant-current constant-voltage (CCCV) charging procedure. In a CCCV charging procedure, a constant current is applied to the battery until a certain voltage is reached. Upon reaching the certain voltage, a constant voltage is applied until the charging current falls below a specified threshold, at which point the battery is considered fully charged. This charging procedure is very robust and simple to implement, however it also suffers from a fairly long charging time.

FIG. 1 illustrates a prior art CCCV charging procedure. Particularly, FIG. 1 includes a plot 102 which shows a battery voltage 104 over time, a plot 106 which shows a battery state of charge 108 over time, and a plot 110 which shows a battery current 112 over time. At a time $t_0$, the CCCV charging procedure begins with a constant current (CC) phase in which a constant current of 6 amperes is applied to the battery. The constant current phase continues until the battery voltage reaches a voltage of 4.2 volts at a time $t_1$. At the time $t_1$, when the battery voltage reaches the voltage of 4.2 volts, the CCCV charging procedure switches to a constant voltage (CV) phase in which a constant voltage of 4.2 volts is applied to the battery. The constant voltage phase continues until the current reaches a very low threshold value (here set to 100 mA) at a time $t_2$, at which point charging is defined to be complete. As shown, after the time $t_2$, the charging current is set to zero.

As can be seen in FIG. 1, the battery state of charge 108 increases from 0% to about 75% during the constant current phase, which lasts about 22 minutes. However, during the constant voltage phase, the battery current 110 begins to decrease dramatically. As a result, the constant voltage phase takes about another 22 minutes in order to bring the battery state of charge 108 from 75% till end of charge. The constant voltage phase charges the battery at a substantially slower rate than the constant current phase, which greatly increases the amount of time to fully charge the battery.

Hence, it would be advantageous to provide a method for charging a lithium ion battery which reduces the length of time required to fully charge the battery while at the same time does not significantly accelerate ageing of the battery.

SUMMARY

A method for charging a battery is disclosed. The method includes the steps of: measuring a battery voltage of the battery with a voltage sensor and a battery current of the battery with a current sensor; applying, with a charging circuit, a first charging current to the battery until the measured battery voltage exceeds a predetermined voltage threshold, a magnitude of the first charging current being held at a first constant value; applying, with the charging circuit, in response to the measured battery voltage exceeding the predetermined voltage threshold, a second charging current to the battery until a cutoff criterion is satisfied, a magnitude of the second charging current being such that the measured battery voltage exceeds a steady state voltage limit for the battery; after the cutoff criterion is satisfied, determining a rest voltage of the battery; and updating the cutoff criterion based on a difference between the determined rest voltage of the battery and a target rest voltage of the battery.

A charging system for charging a battery is disclosed. The charging system includes: a charging circuit configured to connect to a power source and to the battery, the charging circuit configured to draw current from the power source to apply charging currents to the battery; a voltage sensor configured to measure a battery voltage of the battery; a current sensor configured to measure a battery current of the battery; and a charge controller operably connected to the charging circuit, the voltage sensor, and the current sensor. The charge controller configured to: operate the voltage sensor to measure a battery voltage of the battery and operate the current sensor to measure a battery current of the battery; operate the charging circuit to apply a first charging current to the battery until the measured battery voltage exceeds a predetermined voltage threshold, a magnitude of the first charging current being held at a first constant value; and operate the charging circuit to apply, in response to the measured battery voltage exceeding the predetermined voltage threshold, a second charging current to the battery until a cutoff criterion is satisfied, a magnitude of the second charging current being such that the measured battery voltage exceeds a steady state voltage limit for the battery. At least one of the charge controller and a battery controller of the battery is configured to: after the cutoff criterion is satisfied, determine a rest voltage of the battery; and update the cutoff criterion based on a difference between the determined rest voltage of the battery and a target rest voltage of the battery.

BRIEF DESCRIPTION OF THE DRAWINGS

The foregoing aspects and other features of the method and charging system in the following description, taken in connection with the accompanying drawings.

DETAILED DESCRIPTION

Figure 1:
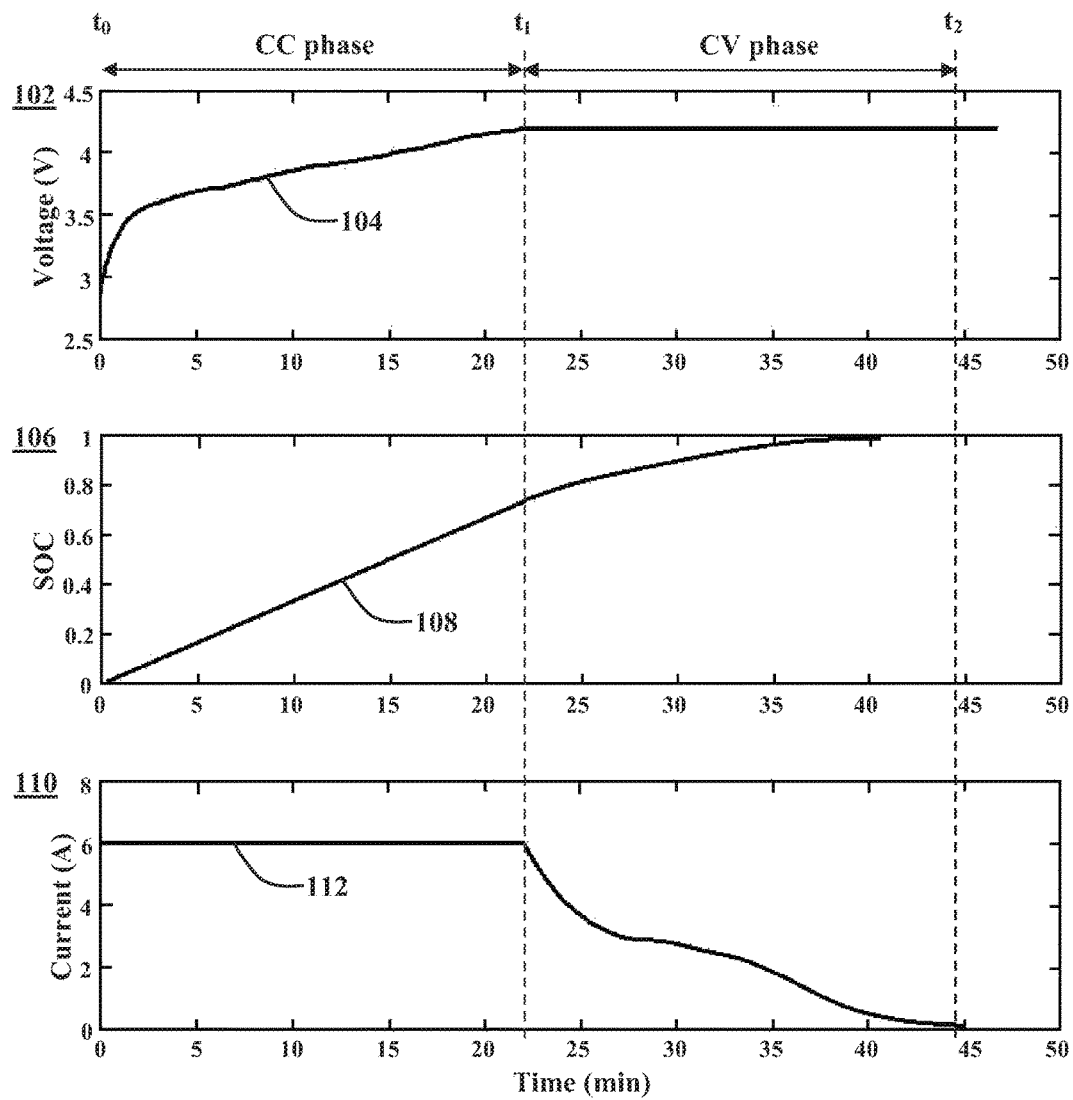
FIG. 1 shows a constant-current constant-voltage (CCCV) charging procedure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

Figure 2:
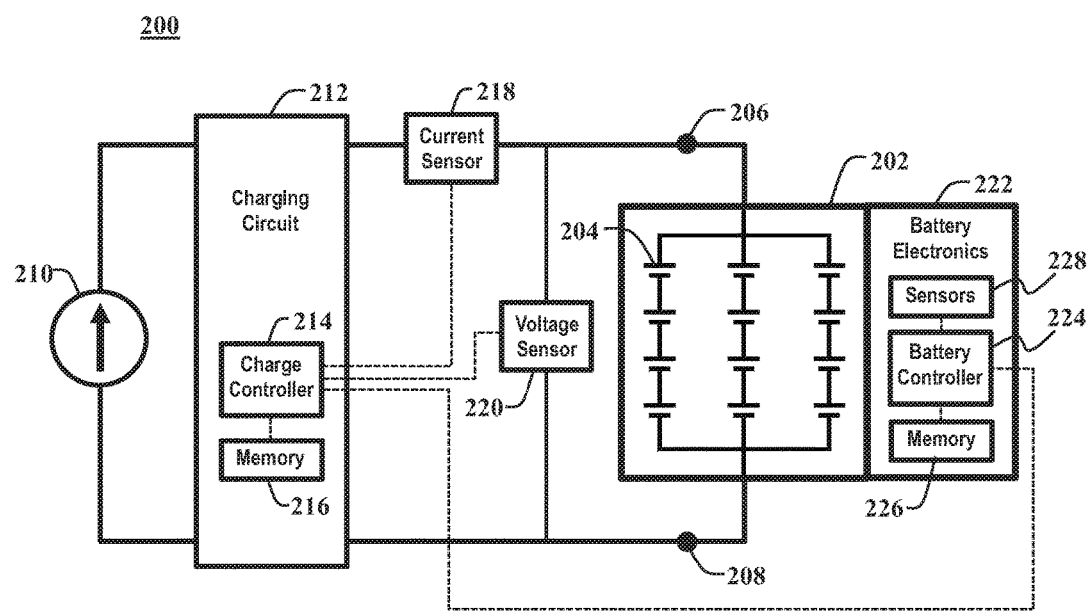
FIG. 2 shows a battery charging system.

FIG. 2 shows a battery charging system 200. The system 200 includes a battery 202 configured to store electrochemical energy. The battery 202 includes one or more electrochemical cells 204 arranged in parallel and/or in series to form the battery 202. In one embodiment, the battery 202 is a lithium-ion battery and the electrochemical cells 204 are lithium-ion cells. The battery 202 includes a positive battery terminal 206 and a negative battery terminal 208 via which the battery 202 provides an output voltage and an output current. Additionally, the battery 202 is configured to be charged via the positive and negative battery terminals 206, 208.

The system 200 further includes a power source 210 and a charging circuit 212. The power source 210 is configured to, during a charging process, apply a charging current and/or a charging voltage to battery 202 via the positive and negative battery terminals 206, 208. In some embodiment, the power source 210 is configured to provide predetermined constant direct-current (DC) voltage or current. In some embodiments, the power source 210 is an alternating-current (AC) voltage or current source. In one embodiment, the power source 210 is a local electric grid (mains) configured to provide a single-phase or three-phase AC voltage having a predetermined frequency, such as 50 Hz or 60 Hz, and a predetermined nominal voltage, such as a nominal voltage between 110-127 volts or 220-240 volts.

A charging circuit 212 is connected between the power source 210 and the battery 202 and is configured to convert, regulate, and/or control the charging current and/or the charging voltage applied to the battery 202 by the power source 210. In some embodiments, the charging circuit 212 includes a charge controller 214 and memory 216 associated with or connected to the charge controller 214. The charging circuit 212 further includes various circuits and hardware configured to convert, regulate, and/or control a charging current and/or charging voltage applied to the battery 202 by the power source 210. The circuits and hardware may include components such as contactors, relays, transistors, transformers, diodes, capacitors, inductors, and resistors arranged in a conventional manner. In some embodiments, additional power conversion circuits may be arranged between the power source 210 and the charging circuit 212, such as a separate AC/DC converter.

The charge controller 214 is configured to operate switches and other components of the charging circuit 212 in order to convert, regulate, and/or control the charging current and/or the charging voltage applied to the battery 202 by the power source 210. In one embodiment, the charge controller 214 comprises a processor configured to execute program instructions which are stored on the memory 216. The memory 216 may be of any type of device capable of storing information accessible by the charge controller 214, such as a memory card, ROM, RAM, write-capable memories, read-only memories, hard drives, discs, flash memory, or any of various other computer-readable media serving as data storage devices as will be recognized by those of ordinary skill in the art. Additionally, it will be recognized by those of ordinary skill in the art that a "controller" or "processor" includes any hardware system, hardware mechanism or hardware component that processes data, signals, or other information. The charge controller 214 may include a system with a central processing unit, multiple processing units, dedicated circuitry for achieving specific functionality, or other systems.

The system 200 further includes a current sensor 218 and voltage sensor 220 configured to monitor battery current and battery voltage, respectively, at least during the charging process. The charge controller 214 is operably connected to both the current sensor 218 and to the voltage sensor 220 and configured to receive measurement signals corresponding to the battery current and the battery voltage. In one embodiment, the current sensor 218 includes a shunt resistor arranged in series with the battery 202 which provides a voltage that is proportional to the battery current. In one embodiment, the current sensor 218 comprises a Hall Effect sensor arranged in series with the battery 202 and configured to measure the battery current. The voltage sensor 220 is connected in parallel with the battery 202 and is configured to measure a battery voltage across the positive and negative battery terminals 206, 208 of the battery 202. In some embodiments, the voltage sensor is further configured to measure voltages of individual cells 204 of the battery 202. In some embodiments, the charge controller 214 is configured to operate the charging circuit 212 using closed-loop feedback control based on the measured battery current and/or measured battery voltage. Particularly, the charge controller 214 is configured to vary the charging current based on a difference (error) between the measured battery current and/or measured battery voltage and the target battery current and/or target battery voltage. In this way, the charge controller 214 is configured to control a charging current in order to track a target battery current or target battery voltage.

The battery 202 further includes battery electronics 222. In some embodiments, the battery electronics 222 include a battery controller 224 and memory 226 associated with or connected to the charge controller 214. The battery controller 224 is configured to monitor battery parameters and communicate these parameters to the charging circuit 212 during the charging process. In some embodiments, the battery controller 224 is configured store the battery parameters in the memory 226. As will be discussed further herein, the battery controller 224 further stores in the memory 226 charging information and/or charging parameters. In one embodiment, the battery controller 224 comprises a processor configured to execute program instructions which are stored on the memory 226. The memory 226 may be of any type of device capable of storing information accessible by the battery controller 224, such as a memory card, ROM, RAM, write-capable memories, read-only memories, hard drives, discs, flash memory, or any of various other computer-readable media serving as data storage devices as will be recognized by those of ordinary skill in the art. Additionally, it will be recognized by those of ordinary skill in the art that a "controller" or "processor" includes any hardware system, hardware mechanism or hardware component that processes data, signals or other information. The battery controller 224 may include a system with a central processing unit, multiple processing units, dedicated circuitry for achieving specific functionality, or other systems.

The battery electronics 222 further include sensors 228 configured to measure parameters of the battery 202. In one embodiment, the sensors 228 include one or more temperature sensors configured to measure temperatures of battery, such as ambient and internal temperatures. In one embodiment, the sensors 228 include one or more current sensors configured to measure a battery current of the battery 202 and/or individual cell currents of the cells 204. In one embodiment, the sensors 228 include one or more voltage sensors configured to measure a battery voltage of the battery 202 and/or individual cell voltages of the cells 204. The current sensors and voltage sensors of the battery electronics 222 may be included in addition to or in substitution of the current sensor 218 and the voltage sensor 220, and may be configured similarly as described above with respect to the sensors 218, 220. In one embodiment, the battery controller 224 is configured to receive measurements from the sensors 228 and/or the sensors 218, 220 and utilize the measurements to determine, calculate, and/or estimate further battery parameters such as state of charge, state of health, open-circuit voltage, and rest voltage.

Both the charging circuit 212 and the battery electronics 222 include transceivers configured to enable bi-directional communication between the charging circuit 212 and the battery electronics 222. As will be discussed in further detail herein, the battery electronics 222 are configured to store charging parameters in the memory 226. When the battery 202 is connected to the charging circuit 212, the battery controller 224 is configured to transmit the charging parameters to charging circuit 212 to be used during the charging procedure. In some embodiments, certain charging parameters are updated after each charge cycle by either the charge controller 214 or the battery controller 224. The memory 226 of the battery 202 stores the most recently updated charging parameters for the respective battery 202. In this way, the charging circuit 212 is can charge different batteries with different charging parameters that are individualized to the type of the battery 202 and the particular condition thereof.

Additionally, in some embodiments, during charging, the battery controller 224 is configured to transmit in real time individual cell voltages, currents, internal temperatures, and ambient temperature to the charge controller 214. This communication between the charge controller 214 and the battery controller 224 enables different types of control strategies. In particular, the feedback control of the charging currents can be based on battery cell level, a battery module level or battery pack level measurements. This provides a tradeoff between performance and measurement precision. In one embodiment, feedback control is based on a weakest battery cell 204 or battery module.

Methods for Fast Charging a Battery

Various methods for charging a battery, such as the battery 202, are described below. In the description of the methods, statements that the method is performing some task or function refers to a controller or general purpose processor executing programmed instructions stored in non-transitory computer readable storage media operatively connected to the controller or processor to manipulate data or to operate one or more components in the system 200 to perform the task or function. Particularly, the charge controller 214 or the battery controller 224 above may be such a controller or processor and the executed program instructions may be stored in the memory 216 or the memory 226. Alternatively, the controller may be implemented with more than one processor and associated circuitry and components, each of which is configured to perform one or more tasks or functions described herein. Additionally, the steps of the methods may be performed in any feasible chronological order, regardless of the order shown in the figures or the order in which the steps are described.

As discussed above, the conventional constant-current constant-voltage (CCCV) charging procedure has lengthy charging times because charging currents provided to the battery during the constant voltage (CV) phase are significantly reduced compared the constant current phase (CC). The methods described herein for charging the battery 202 advantageously modify the conventional CCCV charging procedure to replace the CV phase with a phase in which the battery voltage dynamically exceeds the steady state voltage limit for the battery 202. Particularly, in a second phase after the conclusion of the CC phase, the charge controller 214 is configured to operate the charging circuit 212 to apply a charging current to the battery 202 having a magnitude such that the battery voltage of the battery 202 at least temporarily exceeds the steady state voltage limit for the battery 202. The overall charging time is thereby reduced compared to a charging procedure having a CV in which the charging voltage is held at the steady state voltage limit.

As used herein, the term "steady state voltage limit" refers to a voltage limit that, if exceeded for extended periods of time, is likely to cause damage to the battery or hasten degradation of the battery. The steady state voltage limit is often specified by the manufacturer of the battery, but may also be determined or adjusted over time by a battery system or controller, such as the battery controller 224 or the charge controller 214. The steady state voltage limit is typically greater than a specified nominal voltage of the battery, but is typically lower than any specified dynamic voltage limit of the battery.

The second phase in which that battery voltage exceeds the steady state voltage limit is ended when a cutoff criterion is satisfied. Particularly, in response to a cutoff criterion being satisfied, the charge controller 214 is configured to cease operating the charging circuit 212 to apply any charging current to the battery 202, thus ending the charging process. The cutoff criterion may include, for example, a cutoff current being exceeded, a cutoff voltage being exceeded, or a cutoff timer lapsing. The cutoff criterion is designed such that the battery voltage of the battery 202 settles to a target rest voltage after transient effects of the charging have subsided. In at least one embodiment, the target rest voltage is equal to the steady state voltage limit. In this way, the methods described herein enable faster charging while also ensuring that the battery is not overcharged such that its rest voltage exceeds the steady state voltage limit.

As used herein, the term "rest voltage" refers to the voltage of a battery when a predetermined amount of time has passed since being charged or discharged. Charging and discharging a battery generally causes short term transient effects that manifest in the battery voltage. However, once the current is turned off the battery voltage relaxes to its rest voltage at that state of charge. The rest voltage of a battery changes dependent on the state of charge of the battery. A battery is generally considered fully charged when its rest voltage is equal to the steady state voltage limit and considered fully discharged when its rest voltage is equal to some predefined lower limit. For example, a battery having a nominal voltage of 3.7 Volts might have a rest voltage of 4.2 Volts when it is considered fully charged and a rest voltage of 2.7 Volts when it is considered fully discharged.

As discussed in further detail below, in some embodiments, the cutoff criterion is updated after each charge cycle by the battery controller 224 and/or the charge controller. Information regarding the cutoff criterion is stored in the memory 226 of the battery electronics 222 and is provided to the charge controller 214 for regulating the charging process.

Various illustrative embodiments of the charging process are discussed below in greater detail. However, these embodiments are not exhaustive and those of skill in the art will recognize that other embodiments are within the scope of the disclosure.

First Embodiment Having a Constant Voltage Rate Phase

Figure 3:
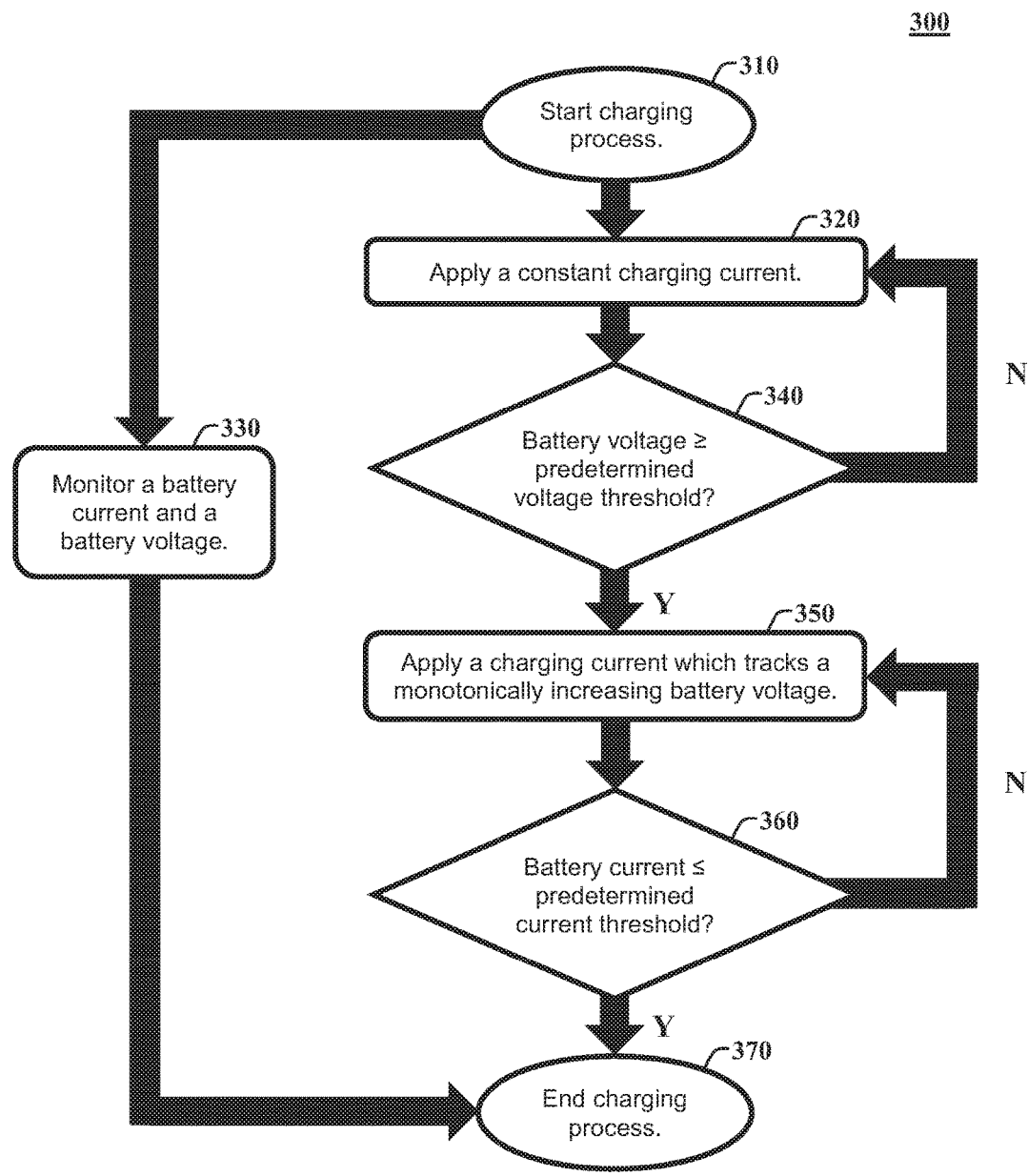
FIG. 3 shows a first method for charging a battery having a constant voltage rate (CdV) phase.

FIG. 3 shows a first method 300 for charging a battery having constant voltage rate (CdV) phase. At a start of a charging process (block 310), the method 300 begins with applying a constant charging current to the battery (block 320). Particularly, with respect to the embodiments described in detail herein, the charge controller 214 is configured to operate the charging circuit 212 to apply a constant charging current to the battery 202. This portion of charging process in which the constant charging current is applied may be referred to herein as the constant current (CC) phase. In some embodiments, the charge controller 214 is configured to operate one or more switches of the charging circuit 212 according to a switching scheme in order to track a target constant charging current for the CC phase. In general, the target constant charging current is selected so as to maximize charge transfer and minimize charging time. In one embodiment, the target constant charging current for the CC phase is a current limit for hardware of the charging circuit 212. In one embodiment, the target constant charging current for the CC phase is a maximum rated current for the battery 202, which may be determined experimentally or specified by a manufacturer of the battery 202 or of the cells 204. In some embodiments, the target constant charging current for the CC phase is adjusted over time as the battery 202 ages. In one embodiment, the target constant charging current for the CC phase is adjusted after each charge cycle of the battery 202.

During the charging process, the method 300 monitors a battery current and battery voltage (block 330). Particularly, the charge controller 214 operates the current sensor 218 to provide a measurement signal representing a measured battery current of the battery 202 and operates the voltage sensor 220 to provide a measurement signal representing a measured battery voltage of the battery 202. The charge controller 214 receives the measurement signals representing the battery current and battery voltage. In one embodiment, the charge controller 214 operates the sensors 218, 220 to measure the battery current and battery voltage continuously. In another embodiment, the charge controller 214 operates the sensors 218, 220 to measure the battery current and battery voltage periodically at a predetermined sample rate. In one embodiment, the charge controller 214 is configured to control the charging current in order to track the target constant charging current for the CC phase using closed-loop feedback control based on the measured battery current.

The method 300 continues applying the constant charging current until the battery voltage exceeds a predetermined voltage threshold (block 340). Particularly, the charge controller 214 is configured to continue operating the charging circuit 212 to apply a constant charging current to the battery 202 until the measured battery voltage exceeds a voltage limit. The charge controller 214 is configured to periodically or continuously compare the measured battery voltage from the voltage sensor 220 with the voltage limit. In response to the measured battery voltage exceeding the voltage limit, the charge controller 214 is configured to cease operating the charging circuit 212 to apply a constant charging current to the battery 202. In one embodiment the voltage limit is a steady state voltage limit specified by the manufacturer of the battery 202 or of the cells 204. In one embodiment, the voltage limit is a rest voltage of the battery 202 when it is fully charged. In some embodiments, the voltage limit is adjusted over time as the battery 202 ages. In one embodiment, the voltage limit is adjusted after each charge cycle of the battery 202.

When the instantaneous measured battery voltage reaches the voltage limit, the battery 202 is not yet fully charged and, if the charging process were ended, the battery voltage would relax to a rest voltage which is less than the desired rest voltage. Accordingly, the method 300 continues by applying a charging current which tracks a monotonically increasing battery voltage in response to the battery voltage exceeding the predetermined voltage threshold (block 350). Particularly, the charge controller 214 is configured to operate the charging circuit 212 to apply a charging current to the battery 202 which tracks a monotonically increasing battery voltage function or profile in response to the measured battery voltage exceeding the voltage limit. As used herein, "monotonically increasing" means that the signal, function, parameter, or the like only increases in magnitude and does not decrease or stay constant. In one embodiment, the charging process includes a phase in which battery voltage increases monotonically at a constant voltage rate, which may be referred to herein as the constant voltage rate (CdV) phase. In one embodiment, the charge controller 214 is configured to control the charging current in order to track the target monotonically increasing battery voltage function using closed-loop feedback control based on the measured battery voltage. Particularly, the charge controller 214 is configured to vary the charging current based on a difference (error) between the measured battery voltage and the target monotonically increasing battery voltage function.

In one embodiment, the charge controller 214 is configured to control the charging current such that the measured battery voltage using a process that tracks the voltage of the battery over time based on: $V(t)=V(t-1)+V_R*\Delta t$, where $V(t-1)$ is the voltage at a previous time step, $\Delta t$ is the sampling time, and $V_R$ is the desired, nonzero, ramp rate. The ramp rate $V_R$ can be specified for different cell types based on cell characterization tests, as well as desired charging times, since a faster ramp rate will result in a lower charging time. In one embodiment, the ramp rate $V_R$ is set dependent on an allowable dynamic peak voltage for the battery 202. In one embodiment, the ramp rate $V_R$ is a constant rate, such as 5 millivolts per minute (mV/min), 10 mV/min, or 20 mV/min. In other embodiments, the ramp rate $V_R$ is variable over time resulting in a nonlinear monotonic function. In some embodiments, the ramp rate $V_R$ is adjusted over time as the battery 202 ages. In one embodiment, the ramp rate $V_R$ is adjusted after each charge cycle of the battery 202.

In some embodiments, the predetermined monotonically increasing battery voltage function includes a series of voltage ramp functions, rather than a single constant slope voltage ramp function. Particularly, in one embodiment, the charge controller 214 is configured to control the charging current such that the measured battery voltage tracks a first voltage ramp function until a first intermediate current/voltage/state-of-charge threshold is reached. In response to the first intermediate current/voltage/state-of-charge threshold being reached, the charge controller 214 is configured to control the charging current such that the measured battery voltage tracks a second voltage ramp function until a second intermediate current/voltage/state-of-charge threshold is reached. This process is repeated for any number of sequential voltage ramp functions. In one embodiment, the slopes of the sequential voltage ramp functions are adjusted as the battery 202 ages. In one embodiment, the intermediate current/voltage/state-of-charge thresholds are adjusted as the battery 202 ages.

The method 300 continues applying the charging current which tracks a monotonically increasing battery voltage until the battery current falls below a predetermined current threshold (block 360) and ending the charging process in response to the battery current falling below the predetermined current threshold (block 370). Particularly, the charge controller 214 is configured to continue operating the charging circuit 212 to apply the charging current to the battery 202 which tracks a monotonically increasing battery voltage function or profile until the measured battery current falls below a cutoff current $I_{cutoff}$. The charge controller 214 is configured to periodically or continuously compare the measured battery current from the current sensor 218 with the cutoff current $I_{cutoff}$. In response to the measured battery current falling below the cutoff current $I_{cutoff}$, the charge controller 214 is configured to cease operating the charging circuit 212 to apply any charging current to the battery 202. In other embodiments, the controller 214 is similarly configured to cease operating the charging circuit 212 to apply any charging current to the battery 202 in response to other cutoff criterion being satisfied, such as expiration of a cutoff timer or the battery voltage exceeding a cutoff voltage. As discussed below in greater detail, the cutoff current $I_{cutoff}$ or other cutoff criterion may be adjusted after each charge cycle.

Figure 4:
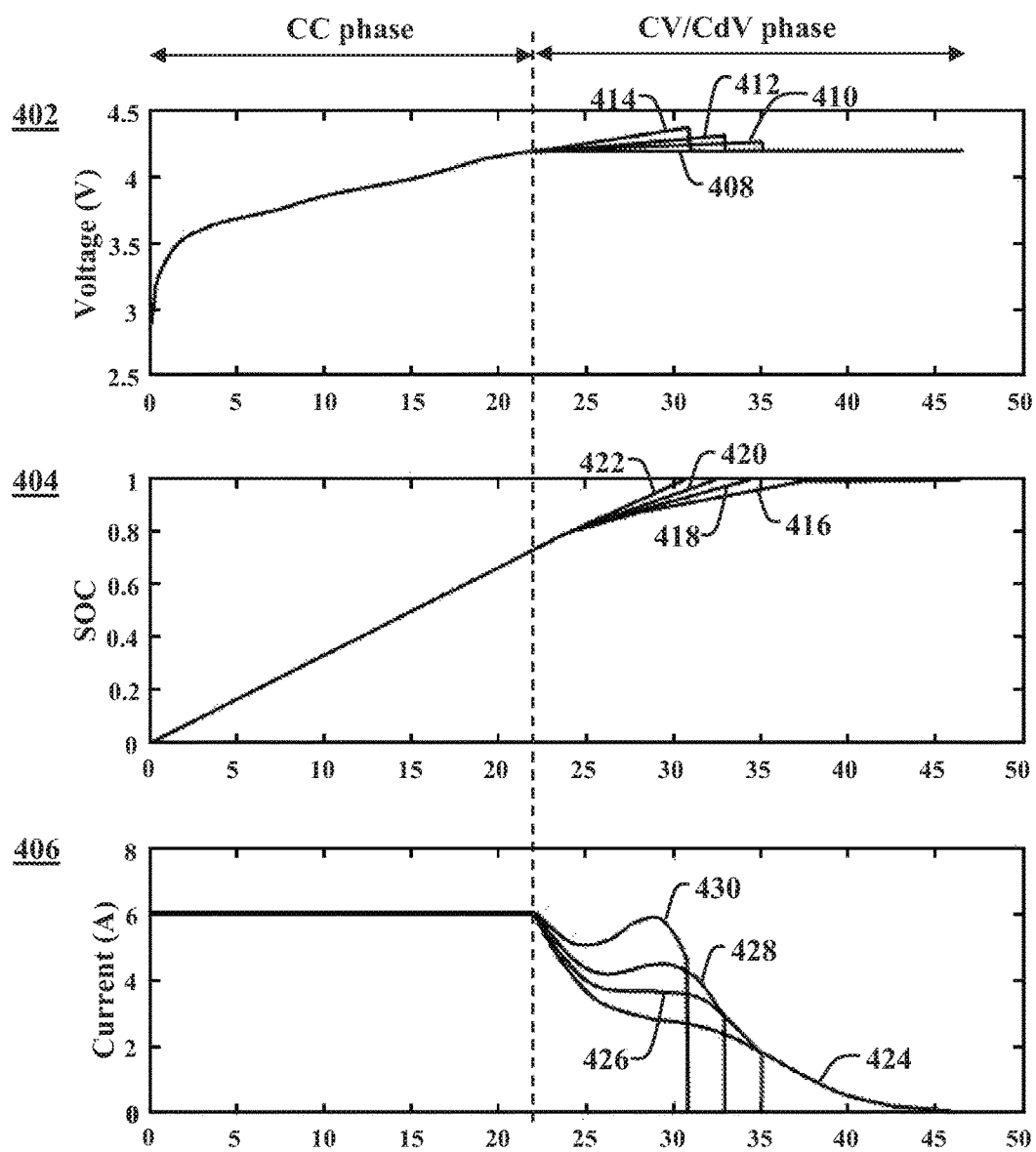
FIG. 4 shows simulations results comparing a standard CCCV charging profile with three CC-CdV charging profiles having different voltage ramp rates.

FIG. 4 shows simulation results comparing a standard CCCV charging profile with three CC-CdV charging profiles having different voltage ramp rates ($V_R$). The plots 402, 404, and 406 depict four different charging procedures: standard CCCV, CC-CdV with $V_R$=5 mV/min, CC-CdV with $V_R$=10 mV/min, and CC-CdV with $V_R$=20 mV/min. Particularly, the plot 402 shows battery voltage profiles 408, 410, 412, and 414 that correspond to standard CCCV, CC-CdV with $V_R$=5 mV/min, CC-CdV with $V_R$=10 mV/min, and CC-CdV with $V_R$=20 mV/min, respectively. Similarly, the plot 404 shows battery state of charge profiles 416, 418, 420, and 422 that correspond to standard CCCV, CC-CdV with $V_R$=5 mV/min, CC-CdV with $V_R$=10 mV/min, and CC-CdV with $V_R$=20 mV/min, respectively. Finally, the plot 406 shows charging current profiles 424, 426, 428, and 430 that correspond to standard CCCV, CC-CdV with $V_R$=5 mV/min, CC-CdV with $V_R$=10 mV/min, and CC-CdV with $V_R$=20 mV/min, respectively.

As can be seen in the plots 402, 404, and 406, the current, voltage, and state of charge profiles are essentially identical in the constant current (CC) phase. However, in the constant voltage rate (CdV) phase, the charging currents 426, 428, and 430 do not decrease as rapidly as the charging current 424 of that corresponds to the constant voltage (CV) phase of the standard CCCV charging procedure. Accordingly, in the constant voltage rate (CdV) phase, the state of charge profiles 418, 420, and 422 do not slow down as quickly when compared to the constant voltage (CV) phase of the standard CCCV charging procedure. As a result, the battery reaches a full charge more quickly using the CC-CdV charging procedures. In particular, with $V_R$=20 mV/min, the constant voltage rate (CdV) is only about 9 minutes long, as compared to the 22 minute long constant voltage (CV) phase of the standard CCCV charging procedure.

Second Embodiment Having a Defined Decreasing Current Phase

Figure 5:
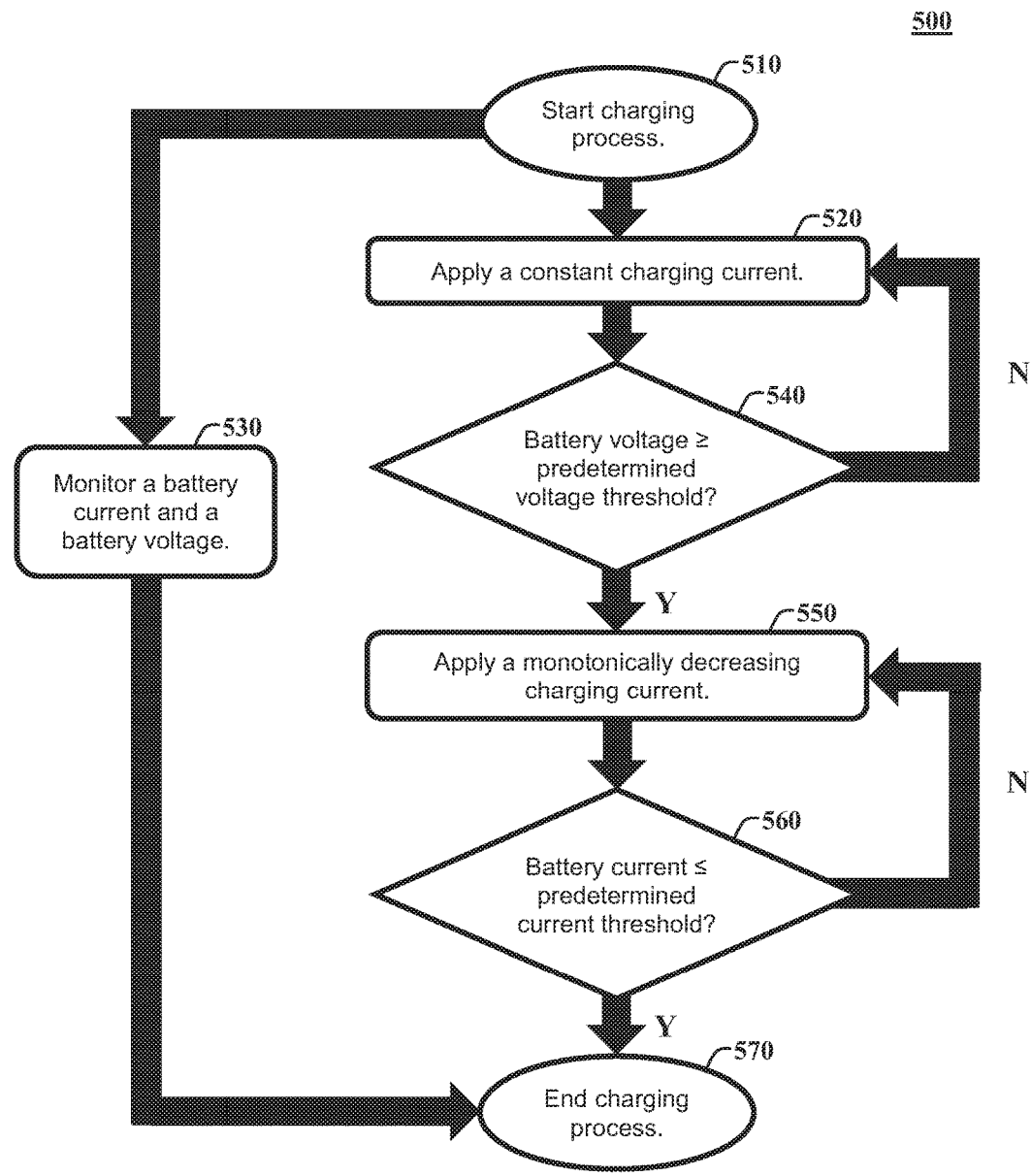
FIG. 5 shows a second method for charging a battery having a defined decreasing current (DDC) phase.

FIG. 5 shows a second method 500 for charging a battery having a defined decreasing current (DDC) phase. At a start of a charging process (block 510), the method 500 begins with applying a constant charging current to the battery (block 520). During the charging process, the method 500 monitors a battery current and battery voltage (block 530). The method 500 continues applying the constant charging current until the battery voltage exceeds a predetermined voltage threshold (block 540). The method steps of blocks 510, 520, 530, and 540 are essentially similar to those of blocks 310, 320, 330, and 340 discussed above with respect to FIG. 3 and are not described again in full detail. This portion of charging process in which the constant charging current is applied may be similarly referred to herein as the constant current (CC) phase.

In response to the battery voltage exceeding the predetermined voltage threshold, the method 500 continues by applying a monotonically decreasing charging current (block 550). Particularly, the charge controller 214 is configured to operate the charging circuit 212 to apply a charging current to the battery 202 which tracks a monotonically decreasing battery current function or profile in response to the measured battery voltage exceeding the voltage limit. As used herein, "monotonically decreasing" means that the signal, function, parameter, or the like only decreases in magnitude and does not increase or stay constant. This portion of the charging process in which battery current decreases monotonically may be referred to herein as the defined decreasing current (DDC) phase. In one embodiment, the charge controller 214 is configured to control the charging current in order to track the target monotonically decreasing battery current function using closed-loop feedback control based on the measured battery current. Particularly, the charge controller 214 is configured to vary the charging current based on a difference (error) between the measured battery current and the target monotonically decreasing battery current function.

In one embodiment, the charge controller 214 is configured to control the charging current with a control process that tracks a measured battery current over time based on: $I(t+\Delta t)=I(t)-f(t)$, where $I(t+\Delta t)$ is the current at a next time step, $\Delta t$ is the sampling time, and the function $f$ is any positive function. The function $f$ can be specified for different cell types based on cell characterization tests, as well as desired charging times and aging behavior. In one embodiment, the function $f$ is set dependent on an allowable dynamic peak voltage for the battery 202. In some embodiments, the function $f$ is adjusted over time as the battery 202 ages. In one embodiment, the function $f$ is adjusted after each charge cycle of the battery 202.

Figure 6:
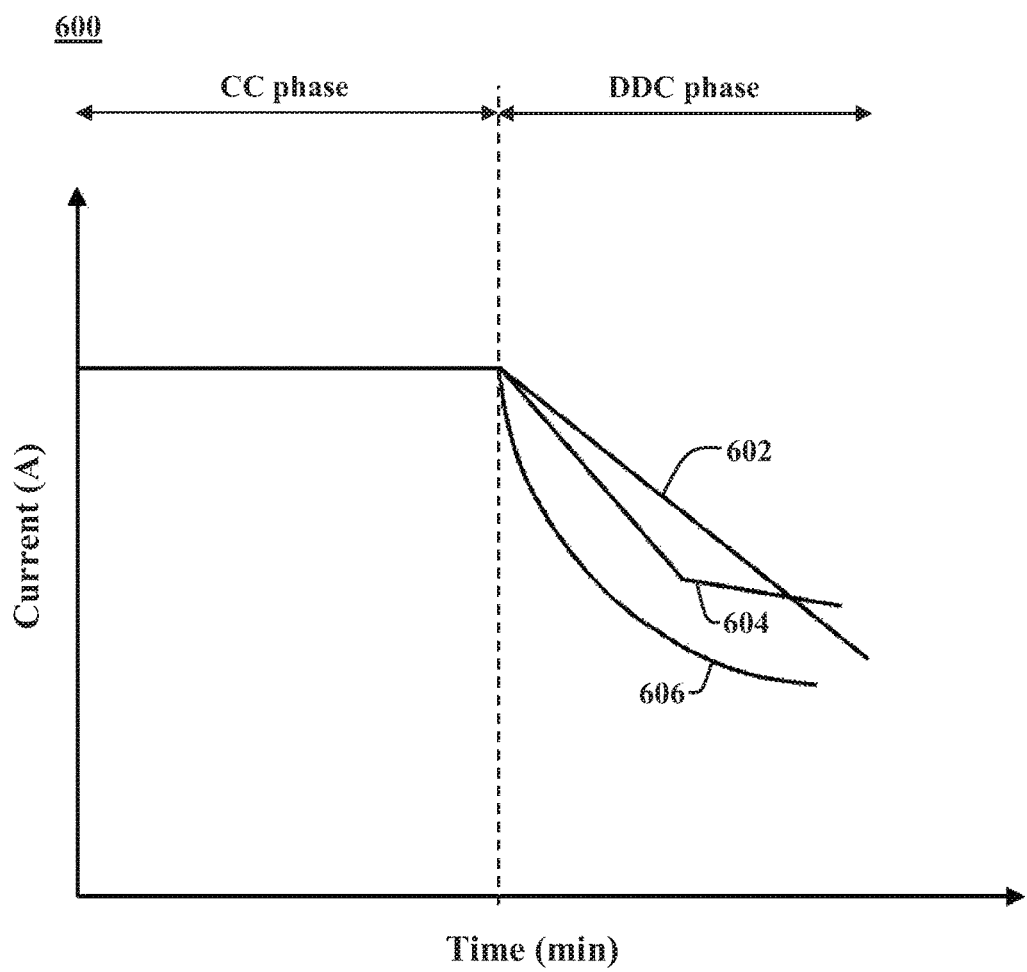
FIG. 6 shows battery current profiles that can be used in the DDC phase.

FIG. 6 shows a battery current profiles that can be used in the DDC phase. Particularly, a plot 600 shows a battery current profiles 602, 604, and 606 each resulting from a different function $f$. The battery current profile 602 has a constant negative slope in the DDC phase and results from setting the function $f=C_R*\Delta t$, where $\Delta t$ is the sampling time and $C_R$ is the desired, nonzero, ramp rate. In this way, the battery current tracks a function having a constant negative slope. This particular embodiment of the DDC phase may also be referred to herein as the constant current rate (CdC) phase. The battery current profile 604 is similar to the battery current profile 602, except that function $f$ is defined with a series of constant ramp rates $C_{R1}$, $C_{R2}$, etc. The transition between each ramp segment can be triggered based on particular intervals of time, or by current/voltage/state-of-charge thresholds (as similarly discussed above with respect to a CdV phase having a series of voltage ramp segments). Finally, the battery current profile 606 has a constantly varying negative slope in the DDC phase and results from setting the function $f$ equal to a positive polynomial, logarithmic, or exponential function.

Returning to FIG. 5, the method 500 continues by applying a monotonically decreasing charging current until the battery current falls below a predetermined current threshold (block 560) and ending the charging process in response to the battery current falling below the predetermined current threshold (block 570). Particularly, the charge controller 214 is configured to continue operating the charging circuit 212 to apply the charging current to the battery 202 that tracks a monotonically decreasing battery current function or profile until the measured battery current falls below a cutoff current $I_{cutoff}$. The charge controller 214 is configured to periodically or continuously compare the measured battery current from the current sensor 218 with the cutoff current $I_{cutoff}$. In response to the measured battery current falling below the cutoff current $I_{cutoff}$, the charge controller 214 is configured to cease operating the charging circuit 212 to apply any charging current to the battery 202. In other embodiments, the controller 214 is similarly configured to cease operating the charging circuit 212 to apply any charging current to the battery 202 in response to another cutoff criterion being satisfied, such as expiration of a cutoff timer or the battery voltage exceeding a cutoff voltage. As discussed below in greater detail, the cutoff current $I_{cutoff}$ or other cutoff criterion may be adjusted after each charge cycle.

Figure 7:
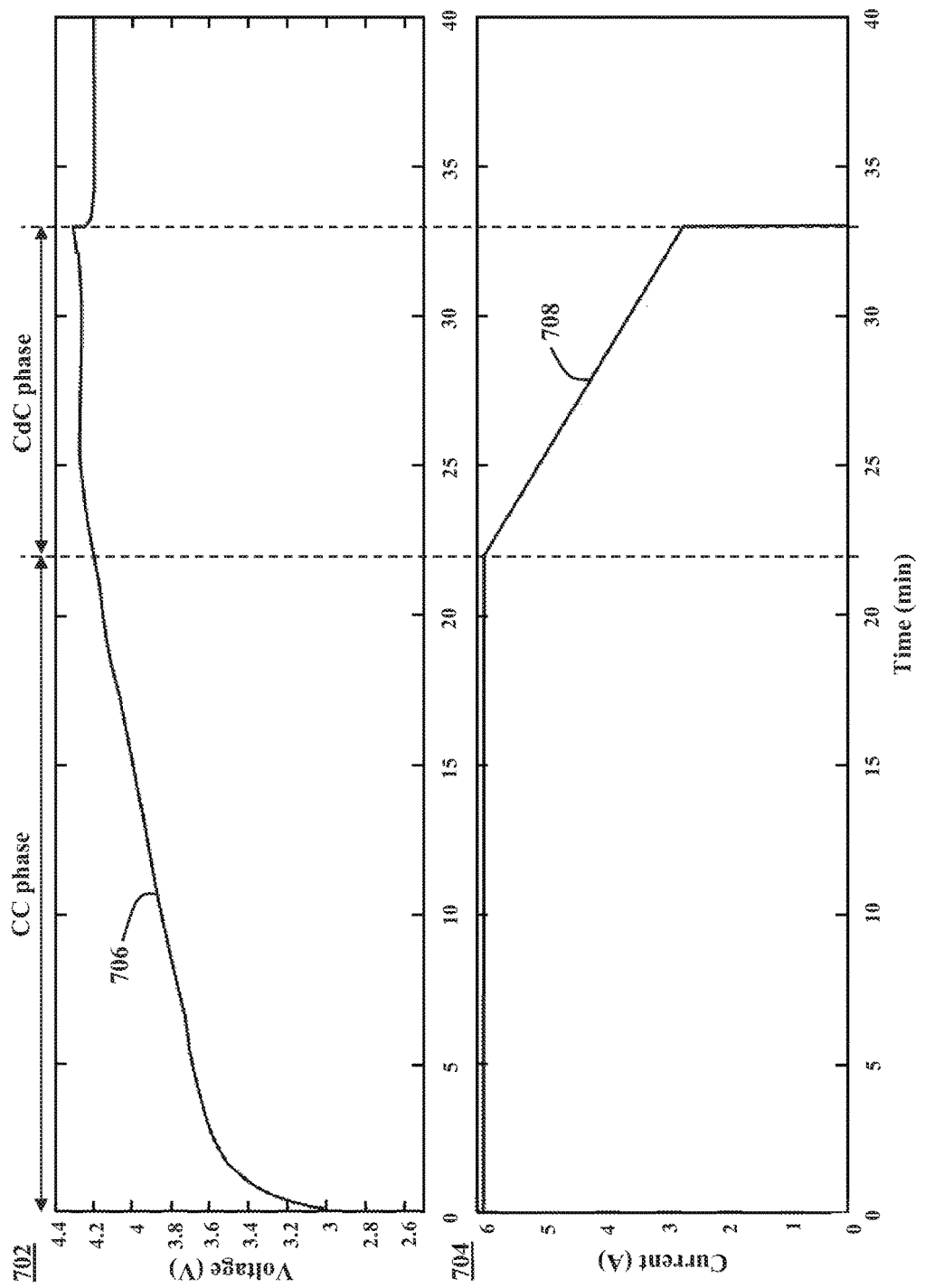
FIG. 7 shows simulation results for a constant-current constant-current-rate (CC-CdC) charging procedure.

FIG. 7 shows simulation results for a constant-current constant-current-rate (CC-CdC) charging procedure. Particularly, the plots 702 and 704 depict a CC-CdC charging procedure with $C_R=300$ mA/min. The plot 702 shows a battery voltage profile 706 during the CC-CdC charging procedure. Similarly, the plot 704 shows a charging current profile 708 during the CC-CdC charging procedure. As can be seen in the plots 702 and 704, the battery current is decreased at a constant rate of 300 mA/min during the constant current rate (CdC) phase. This generally provides for increased charging currents as compared to the constant voltage (CV) phase of the standard CCCV charging procedure. As a result, the battery voltage continues to rise beyond the target rest voltage and/or steady state voltage limit of 4.2 Volts. The greater charging currents and voltages enable the battery to reach a full charge more quickly as compared to the standard CCCV charging procedure. In particular, with $C_R=300$ mA/min, the constant current rate (CdC) phase is only about 11 minutes long, as compared to the 22 minute long constant voltage (CV) phase of the standard CCCV charging procedure. As can be seen, after the charging procedure has concluded, the battery voltage decays to a desired rest voltage of 4.2 Volts.

Figure 8:
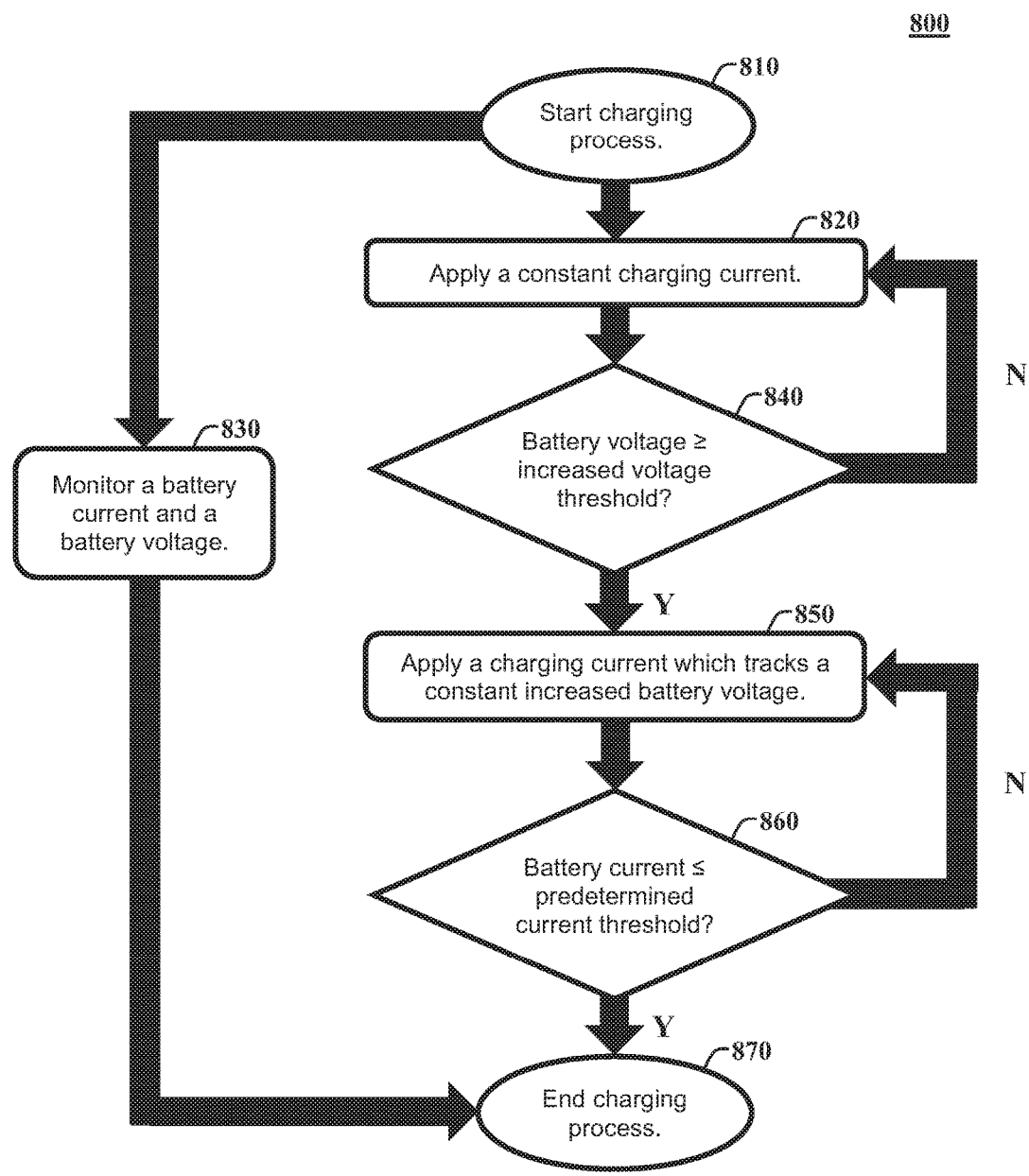
FIG. 8 shows a third method for charging a battery having an extended constant current (CC) phase and a constant increased voltage (CV+) phase.

Third Embodiment Having Extended Constant Current Phase and Constant Increased Voltage Phase FIG. 8 shows a third method 800 for charging a battery having an extended constant current (CC) phase and a constant increased voltage (CV+) phase. At a start of a charging process (block 810), the method 800 begins with applying a constant charging current to the battery (block 820). During the charging process, the method 800 monitors a battery current and battery voltage (block 830). The method steps of blocks 510, 520, and 530 are essentially similar to those of blocks 310, 320, and 330 discussed above with respect to FIG. 3 and are not described again in full detail. This portion of charging process in which the constant charging current is applied may be similarly referred to herein as the constant current (CC) phase.

The method 800 continues applying the constant charging current until the battery voltage exceeds an increased voltage threshold that is greater than the steady state voltage limit of the battery (block 840). Particularly, the charge controller 214 is configured to continue operating the charging circuit 212 to apply a constant charging current to the battery 202 until the measured battery voltage exceeds an increased voltage limit. The charge controller 214 is configured to periodically or continuously compare the measured battery voltage from the voltage sensor 220 with the increased voltage limit. In response to the measured battery voltage exceeding the increased voltage limit, the charge controller 214 is configured to cease operating the charging circuit 212 to apply a constant charging current to the battery 202. Unlike the previously discussed methods, the voltage limit is not set to the steady state voltage limit of the battery 202 and/or to a target rest voltage for the battery 202. Instead, the voltage threshold that ends the CC phase is set to a voltage that is greater than the steady state voltage limit for the battery. For example, if the steady state voltage limit and target rest voltage for the battery 202 is 4.2 Volts then the voltage limit that ends the CC phase may be set to 4.35 Volts. In one embodiment, the increased voltage limit is set to a predetermined amount or predetermined percentage greater than the steady state voltage limit. In this way, the CC phase of the method 800 is extended compared to a standard CCCV charging procedure.

In response to the battery voltage exceeding the increased voltage threshold, the method 800 continues by applying a charging current that tracks a constant battery voltage that is greater than the steady state voltage limit of the battery (block 850). Particularly, the charge controller 214 is configured to operate the charging circuit 212 to apply a charging current to the battery 202 which tracks a constant battery voltage that is greater than the steady state voltage limit of the battery 202 and/or the target rest voltage of the battery 202 in response to the measured battery voltage exceeding the increased voltage limit. This portion of the charging process in which battery voltage is held at a constant voltage that exceeds the steady state voltage limit of the battery may be referred to herein as the constant increased voltage (CV+) phase. In one embodiment, the charge controller 214 is configured to control the charging current in order to track the target constant increased battery voltage using closed-loop feedback control based on the measured battery voltage. Particularly, the charge controller 214 is configured to vary the charging current based on a difference (error) between the measured battery voltage and the target constant increased battery voltage.

In at least one embodiment, the target constant increased battery voltage is equal to the increased voltage limit, but can also be set differently. The target constant increased battery voltage and/or increased voltage limit can be specified for different cell types based on cell characterization tests, as well as desired charging times. In one embodiment, the target constant increased battery voltage and/or increased voltage limit is set dependent on an allowable dynamic peak voltage for the battery 202. In some embodiments, the target constant increased battery voltage and/or increased voltage limit is adjusted over time as the battery 202 ages. In one embodiment, the target constant increased battery voltage and/or increased voltage limit is adjusted after each charge cycle of the battery 202.

The method 800 continues applying the charging current which tracks the constant increased battery voltage until the battery current falls below a predetermined current threshold (block 860) and ending the charging process in response to the battery current falling below the predetermined current threshold (block 870). Particularly, the charge controller 214 is configured to continue operating the charging circuit 212 to apply the charging current to the battery 202 which tracks the target constant increased battery voltage until the measured battery current falls below a cutoff current $I_{cutoff}$. The charge controller 214 is configured to periodically or continuously compare the measured battery current from the current sensor 218 with the cutoff current $I_{cutoff}$. In response to the measured battery current falling below the cutoff current $I_{cutoff}$, the charge controller 214 is configured to cease operating the charging circuit 212 to apply any charging current to the battery 202. In other embodiments, the controller 214 is similarly configured to cease operating the charging circuit 212 to apply any charging current to the battery 202 in response to another cutoff criterion being satisfied, such as expiration of a cutoff timer. As discussed below in greater detail, the cutoff current $I_{cutoff}$ or other cutoff criterion may be adjusted after each charge cycle.

Figure 9:
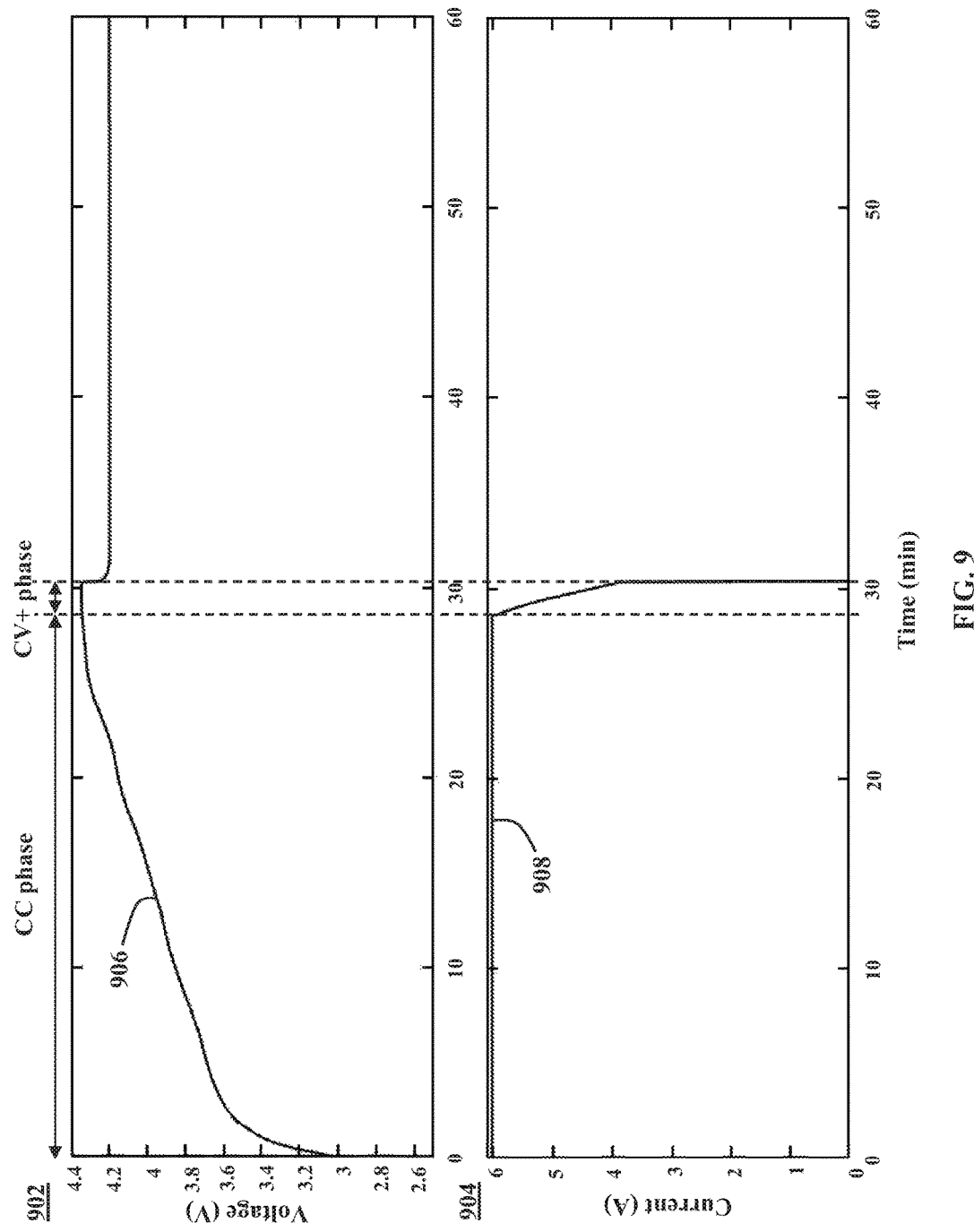
FIG. 9 shows simulation results for an extended constant-current constant-increased-voltage (CC-CV+) charging procedure.

FIG. 9 shows simulation results for an extended constant-current constant-increased-voltage (CC-CV+) charging procedure. Particularly, the plots 902 and 904 depict a CC-CV+ charging procedure with the increased voltage limit set to 4.35 Volts and the target constant increased battery voltage also set to 4.35 Volts. The plot 902 shows a battery voltage profile 906 during the CC-CV+ charging procedure. Similarly, the plot 904 shows a charging current profile 908 during the CC-CV+ charging procedure. As can be seen in the plot 902, the battery voltage reaches the steady state voltage limit of 4.2 Volts at about 22 minutes. However, the CC phase continues until the battery voltage reaches the increased voltage limit of 4.35 Volts at about 29 minutes. Thus, the CC phase is extended by about 7 minutes as compared to the constant current (CC) phase of the standard CCCV charging procedure, thereby providing for increased charging currents during the CC-CV+ charging procedure. Once the battery voltage reaches the increased voltage limit of 4.35 Volts, the constant increased voltage (CV+) phase brings the battery to a full charge in just over a minute, netting a total charge time of just over 30 minutes. As can be seen, after the charging procedure has concluded, the battery voltage decays to a desired rest voltage of 4.2 Volts.

Fourth Embodiment Having Second Constant Current Phase

Figure 10:
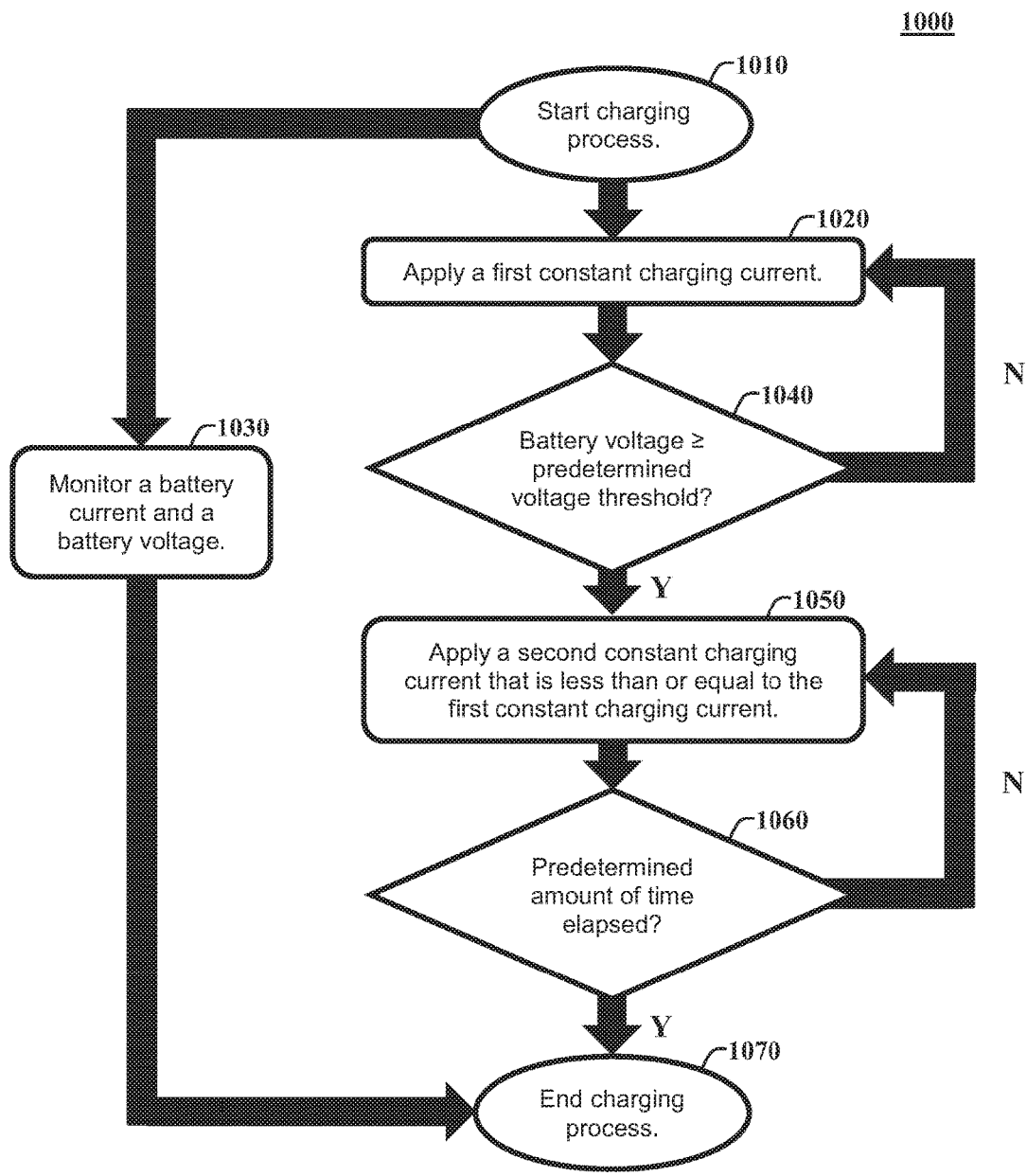
FIG. 10 fourth method for charging a battery having a constant decreased current (CDC) phase.
Figure 11:
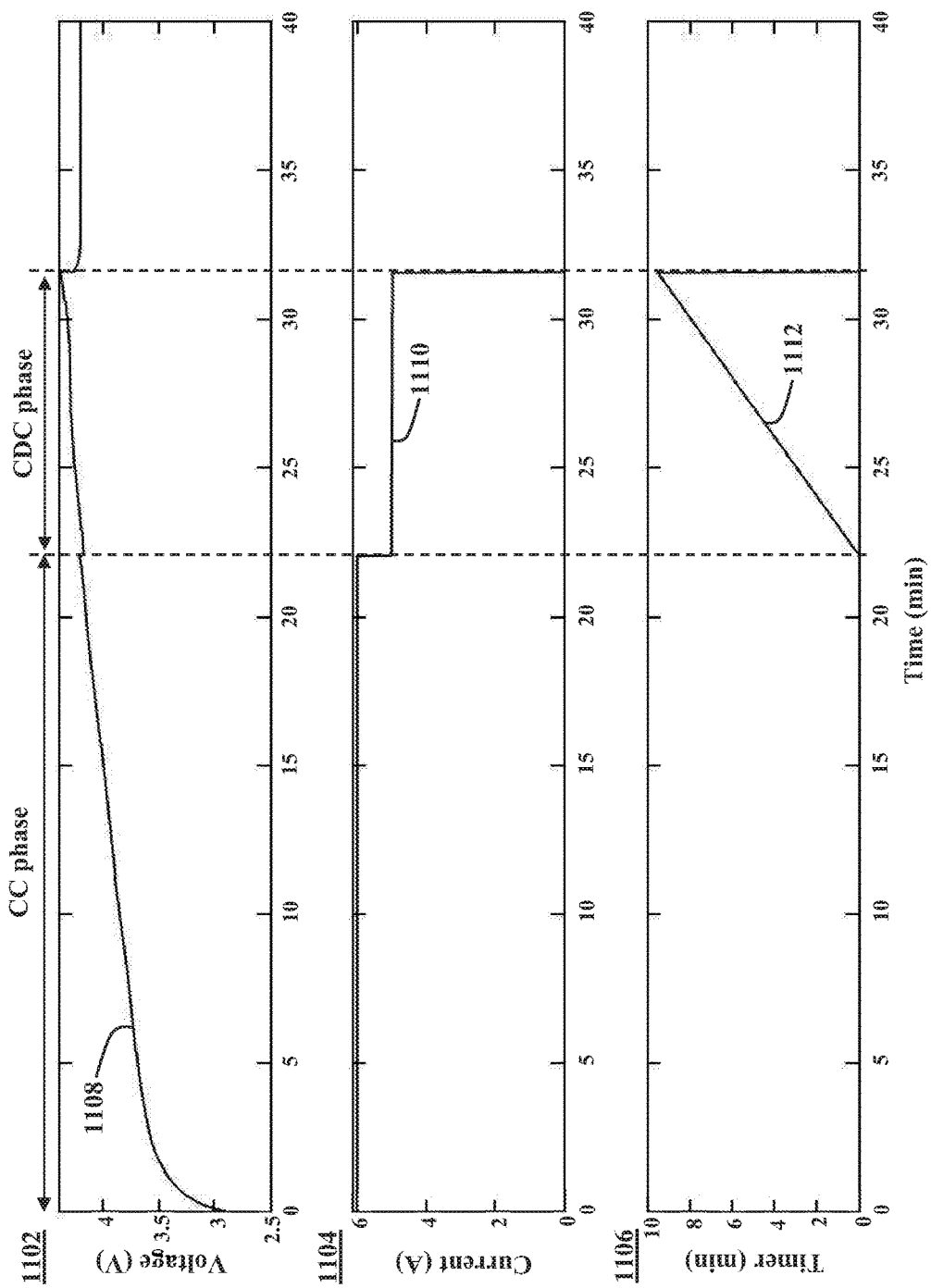
FIG. 11 shows simulation results for a constant-current constant-decreased-current (CC-CDC) charging procedure.

FIG. 10 shows a fourth method 1000 for charging a battery having a constant decreased current (CDC) phase. At a start of a charging process (block 1010), the method 1000 begins with applying a first constant charging current to the battery (block 1020). During the charging process, the method 1000 monitors a battery current and battery voltage (block 1030). The method 1000 continues applying the first constant charging current until the battery voltage exceeds a predetermined voltage threshold (block 1040). The method steps of blocks 1010, 1020, 1030, and 1040 are essentially similar to those of blocks 310, 320, 330, and 340 discussed above with respect to FIG. 3 and are not described again in full detail. This portion of charging process in which the constant charging current is applied may be similarly referred to herein as the first constant current (CC) phase.

In response to the battery voltage exceeding the predetermined voltage threshold, the method 1000 continues by applying a second constant charging current that is less than or equal to the first charging current (block 1050). Particularly, the charge controller 214 is configured to operate the charging circuit 212 to apply a second constant charging current to the battery 202 that is equal to or less than the first constant charging current applied in the first CC phase in response to the measured battery voltage exceeding the voltage limit. This portion of the charging process in which the second constant current is applied be referred to herein as the second constant current (CC) phase. In one embodiment, the charge controller 214 is configured to control the charging current in order to track the second constant current level using closed-loop feedback control based on the measured battery current. Particularly, the charge controller 214 is configured to vary the charging current based on a difference (error) between the measured battery current and the target second constant battery current.

In one embodiment, the target second constant battery current is less than the target first constant battery current by a predetermined percentage, ratio, and/or amount. The target second constant battery current can be specified for different cell types based on cell characterization tests, as well as desired charging times. In one embodiment, the target second constant battery current is set dependent on an allowable dynamic peak voltage for the battery 202. In some embodiments, the target second constant battery current is adjusted over time as the battery 202 ages. In one embodiment, the target second constant battery current is adjusted after each charge cycle of the battery 202.

The method 1000 continues applying the second charging current until a predetermined amount of time elapses (block 1060) and ending the charging process in response to the predetermined amount of time elapsing (block 1070). Particularly, the charge controller 214 is configured to continue operating the charging circuit 212 to apply the second constant charging current to the battery 202 until a cutoff timer $T_{cutoff}$ expires. The cutoff timer $T_{cutoff}$ is initiated or started concurrently with the start of the second CC phase and/or in response to the measured battery voltage exceeding the voltage limit. The charge controller 214 is configured to periodically or continuously compare the elapsed time since the start of applying the second constant charging current with the cutoff timer $T_{cutoff}$. In response to the elapsed time since the start of applying the second constant charging current exceeding the cutoff timer $T_{cutoff}$, the charge controller 214 is configured to cease operating the charging circuit 212 to apply any charging current to the battery 202. In other embodiments, the controller 214 is similarly configured to cease operating the charging circuit 212 to apply any charging current to the battery 202 in response to other cutoff criterion being satisfied, a voltage threshold being exceeded. As discussed below in greater detail, the cutoff timer $T_{cutoff}$ or other cutoff criterion may be adjusted after each charge cycle.

FIG. 10 shows simulation results for a constant-current constant-current (CC-CC) charging procedure. Particularly, the plots 1102, 1104, and 1106 depict a CC-CC charging procedure having a first CC phase having a first constant current a second CC phase having a second constant current that is less than the first constant current. The plot 1102 shows a battery voltage profile 1108 during the CC-CC charging procedure. Similarly, the plot 1104 shows a charging current profile 1110 during the CC-CC charging procedure. Finally, the plot 1106 shows a cutoff timer profile 1112 during the CC-CC charging procedure. As can be seen in the plot 1104, the battery current is set at a constant 6 Amperes during the first CC phase and is reduced to constant 5 Amperes during the second CC phase at about 22 minutes. This second CC phase generally provides for increased charging currents as compared to the constant voltage (CV) phase of the standard CCCV charging procedure. During the second CC phase, the battery voltage continues to rise beyond the target rest voltage and/or steady state voltage limit of 4.2 Volts. The greater charging currents and voltages enable the battery to reach a full charge more quickly as compared to the standard CCCV charging procedure. Particularly, as can be seen in the plot 1106, the cutoff timer is initiated concurrently with the second CC phase and is set to expire a little over 9 minutes from the initiation of the second CC phase, as compared to the 22 minute long constant voltage (CV) phase of the standard CCCV charging procedure. As can be seen, after the charging procedure has concluded, the battery voltage decays to a desired rest voltage of 4.2 Volts.

Adaptation of Cutoff Criterion

As discussed above, the second phase in which that battery voltage exceeds the steady state voltage limit is ended when a cutoff criterion is satisfied. The cutoff criterion is designed to stop the charging procedure when the battery is fully charged and to prevent over charging. In other words, the cutoff criterion is designed to ensure that, after the charging procedure is concluded, the battery voltage relaxes to the steady state voltage limit and/or another target rest voltage at which the battery is considered fully charged. In at least one embodiment, the cutoff criterion is advantageously adapted as the battery ages in order to better enable full charging and prevent over charging of the battery.

Figure 12:
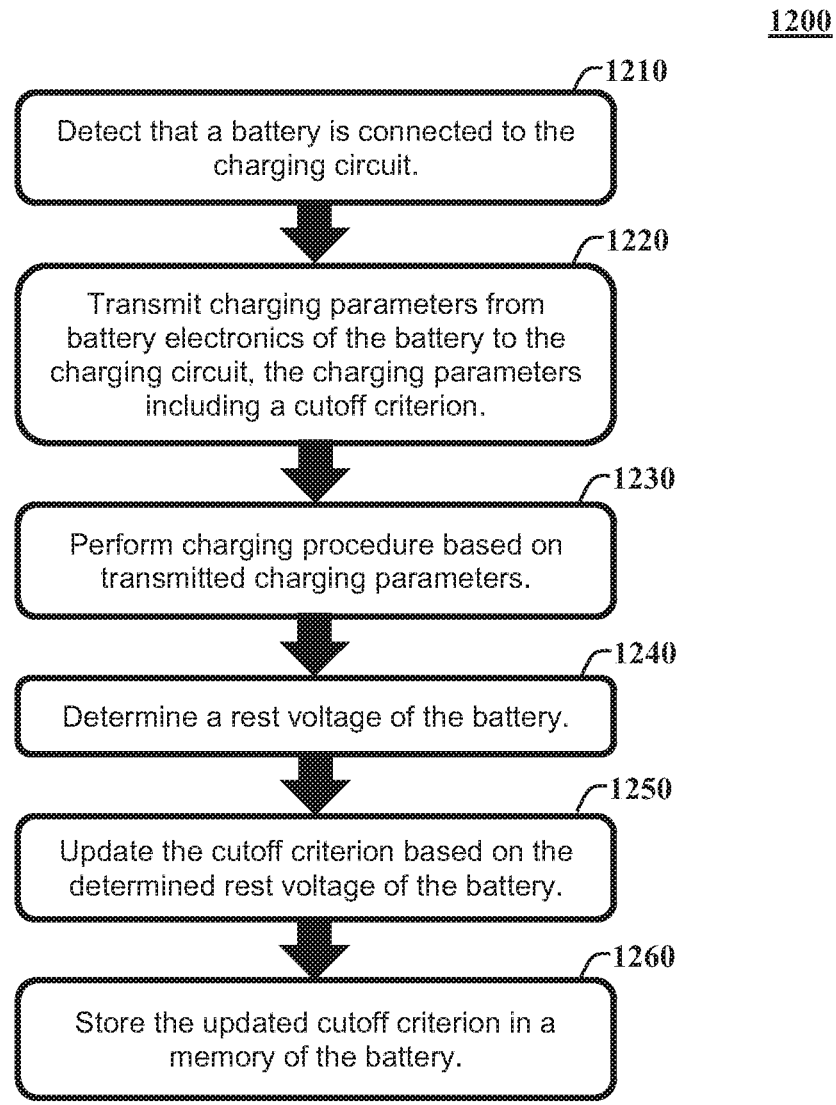
FIG. 12 shows a method for adapting the charging procedure cutoff criterion over time as the battery ages.

FIG. 12 shows a method 1200 for adapting cutoff criterion of the charging procedure over time as the battery ages. The method 1200 begins when it is detected that a battery is connected to the charging circuit (block 1210). Particularly, with respect to the embodiments described herein, the charge controller 214 is configured to detect that a battery 202 has been connected. When a battery has been connected to the charging circuit, the method 1200 continues by transmitting charging parameters, which at least include a cutoff criterion, from battery electronics of the battery to the charging circuit (block 1220). Particularly, in response to being connected to the charging circuit via the terminals 206, 208, the battery electronics 222 and/or the battery controller 224 is configured to read charging parameters from the memory 226 and to transmit the charging parameters to the charging circuit 212 and/or the charge controller 214. The charging parameters at least include information regarding a cutoff criterion, such as a value for the cutoff current $I_{cutoff}$ or a value for cutoff timer $T_{cutoff}$. However, the charging parameters may further include rest voltages from previous charge cycles, battery impedances from previous charge cycles, a constant current level and/or a voltage limit for the initial CC phase of the charging procedure, a voltage function or profile for tracking during a CdV phase, a current function or profile for tracking during a DDC phase, a constant voltage level for a CV+ phase, and/or a constant current level for a CDC phase. Additionally, the charging parameters may specify a particular charging procedure/algorithm to be used for charging the particular battery 202, such as one of those described above.

After the charging circuit has received the charging parameters, the method 1200 continues with performing a charging procedure based on the received charging parameters (block 1230). Particularly, after receiving the charging parameters from the battery electronics 222 and/or the battery controller 224, the charge controller 214 is configured to operate the charging circuit 212 to perform a charging procedure for charging that battery 202 in accordance with the received charging parameters. In at least one embodiment, the charging procedure is one of the methods 300, 500, 800, and 1000 discussed above, and is ended upon satisfaction of the cutoff criterion received from the battery 202 prior to performing the charging procedure.

After the charging procedure has concluded, the method 1200 continues by determining a rest voltage of the battery (block 1240), updating the cutoff criterion based on the determined rest voltage of the battery (1250), transmitting the updated cutoff criterion back to the battery if the cutoff criterion was updated by the charge controller, and storing the updated cutoff criterion in a memory of the battery (1260). This adaptation of the cutoff criterion is performed after each charge cycle or periodically after a predetermined number of charge cycles. Additionally, in some embodiments, the adaptation of the cutoff criterion can be performed before or during the next charge cycle, such as during the constant current phase of the next charge cycle. In some embodiments, the adaptation of the cutoff criterion is performed by the charge controller 214. Particularly, after the charging procedure has concluded, the charge controller 214 is configured to determine the rest voltage of the battery 202 by measurement or estimation. The charge controller 214 is configured to calculate an updated value for the cutoff criterion based on the determined rest voltage of the battery and transmit the updated cutoff criterion to the battery controller 224. The battery controller 224 is configured to receive the updated cutoff criterion from the charge controller 212 and to store the updated cutoff criterion in the memory 226 for use in the next charge cycle. In other embodiments, the adaptation of the cutoff criterion is performed by the battery controller 224. Particularly, after the charging procedure has concluded, the battery controller 224 is configured configure to determine the rest voltage of the battery 202 by measurement or by estimation. The battery controller 224 is configured to calculate an updated value for the cutoff criterion based on the determined rest voltage of the battery and store the updated cutoff criterion in the memory 226 for use in the next charge cycle. In one embodiment, the battery electronics 222 and/or the charge circuit 212 is triggered to shut down after the cutoff criterion has been updated and stored.

The determination of the rest voltage of the battery (block 1240) is performed by direct measurement or by estimation, depending on the circumstances. Particularly, if a sufficient amount of time has elapsed since the conclusion of the charging procedure, the rest voltage can be measured directly. Particularly, in one embodiment the charge controller 214 is configured to operate the voltage sensor 220 to measure the rest voltage of the battery 202 after a predetermined time period has elapsed since the charging procedure concluded (i.e. since the cutoff criterion was satisfied). Similarly, in one embodiment, the battery controller 224 is configured to operate a voltage sensor of the sensors 228 to measure the rest voltage of the battery 202 after a predetermined time period has elapsed since the charging procedure concluded. The predetermined time period is chosen such that any transients resulting from the charging procedure have subsided.

However, in some circumstances, the rest voltage of the battery 202 cannot be measured directly. Particularly, if the battery 202 is immediately disconnected from the charging circuit 212 after the charging procedure has concluded, then the charge circuit 212 cannot measure the rest voltage of the battery because there was not sufficient time for transients resulting from the charging procedure to subside. Similarly, if the battery 202 is put into use (i.e. discharged into a load) immediately after the charging procedure has concluded, then the rest voltage also cannot be directly measured. Furthermore, if the battery 202 is disconnected before it is fully charged, then rest voltage at full charge cannot be measured. Accordingly, in some embodiments, the rest voltage of the battery 202 must be estimated before updating the cutoff criterion. Particularly, in response to the battery 202 not being fully charged, the battery 202 being discharged before the elapse of the predetermined time period, or the battery 202 being disconnected before the elapse of the predetermined time period, then the charge controller 214 and/or the battery controller 214 is configured to estimate the rest voltage of the battery 202. In one embodiment, the charge controller 214 and/or the battery controller 214 is configured to estimate the rest voltage based on dynamic voltage measurements as the battery 202 relaxes, even if the relaxation is not completed. In some embodiments, different methods are used to estimate the rest voltage, such as a dynamic estimator (e.g. Luenberger observers or Kalman filters), model fitting (e.g. fitting a sum of exponentials to the relaxation curve), or iterative learning over several charge cycles. In some embodiments in which the charge controller 214 estimates the rest voltage, the battery controller 224 is configured to transmit information regarding a rest voltage estimation algorithm to the charge controller which is used to estimate the rest voltage of the battery.

Alternatively, in some embodiments, if the rest voltage cannot be measured directly or if the rest voltage cannot be accurately estimated, then the adjustment of the cutoff criterion can be suppressed and the previous value for the cutoff criterion will be used for the next charge cycle.

As discussed above, after the rest voltage is determined, the cutoff criterion is updated based on the rest voltage (block 1250). Generally, the cutoff criterion is designed such that, after the charging procedure is ended, the battery voltage of the battery 202 relaxes to the steady state voltage limit of the battery 202 and/or another target rest voltage at which the battery 202 is considered fully charged.

The cutoff criterion can be updated after each charge cycle using a proportional feedback control process. For example, in embodiments that utilize a cutoff current $I_{cutoff}$ as the cutoff criterion, such as the methods 300, 500, and 800, the charge controller 214 and/or the battery controller 224 is configured to adjust the cutoff current using an process that is based on: $I_{cutoff}(k)=I_{cutoff}(k-1)+K^*(V_{rest}(k-1)-V_{rest,target})$, where k is the current charge cycle, $I_{cutoff}(k)$ is the adjusted cutoff current, $I_{cutoff}(k-1)$ is the cutoff current for the previous charge cycle, $V_{rest}(k-1)$ is the measured or estimated rest voltage after the previous charge cycle, $V_{rest,target}$ is the target rest voltage, and K is the proportional feedback gain. In some embodiments, K is a function of other values. Similarly, in embodiments that utilize a cutoff timer $T_{cutoff}$ as a cutoff criterion, such as the method 1000, the charge controller 214 and/or the battery controller 224 is configured to adjust the cutoff timer using a control process that is based on: $T_{cutoff}(k)=T_{cutoff}(k-1)-K^*(V_{rest}(k-1)-V_{rest,target})$, where $T_{cutoff}(k)$ is the adjusted cutoff timer and $T_{cutoff}(k-1)$ is the cutoff timer for the previous charge cycle. Finally, in embodiments that utilize a cutoff voltage $V_{cutoff}$ as a cutoff criterion, the charge controller 214 and/or the battery controller 224 is configured to adjust the cutoff voltage using a control process that based on: $V_{cutoff}(k)=V_{cutoff}(k-1)-K^*(V_{rest}(k-1)-V_{rest,target})$, where $V_{cutoff}(k)$ is the adjusted cutoff voltage and $V_{cutoff}(k-1)$ is the cutoff voltage for the previous charge cycle. In one embodiment the target rest voltage $V_{rest,target}$ is a steady state voltage limit specified by the manufacturer of the battery 202 or of the cells 204. In one embodiment, the target rest voltage $V_{rest,target}$ is some other target rest voltage at which the battery 202 is considered fully charged. In other embodiments, other types of feedback control are used, such as proportional-integral-derivative control, rule-based control, or any nonlinear control strategy. In further embodiments, other information is used to adjust the cutoff criterion, such as cell impedance of the cells 204 or of the battery 202, as discussed below.

The adaptation of the cutoff criteria $I_{cutoff}$, $T_{cutoff}$, and $V_{cutoff}$ using processes and equations described above primarily corrects for battery ageing behavior due to capacity degradation. However, during typical battery usage, the ambient temperature at which the battery 202 is charged can vary significantly. Such a change in operating condition directly impacts the impedance of the battery 202, which in turn affects the battery voltage behavior during the charging procedure. Consequently, the cutoff criteria $I_{cutoff}$, $T_{cutoff}$, and $V_{cutoff}$ are highly sensitive to variations in battery impedance over time, and this dependency is not captured by the adaptation processes and equations described above.

In one embodiment, the adaptation process is modified to include a step of determining an impedance of the battery. The cutoff criterion $I_{cutoff}$, $T_{cutoff}$, or $V_{cutoff}$ is then updated based on the determined impedance, as well as based on the determined rest voltage as discussed above. Particularly, the relevant cutoff criterion is updated based on a difference between the determined impedance of the battery in the current charge cycle and an impedance of the battery determined in a previous charge cycle of the battery, as well as based on a difference between the determined rest voltage of the battery during the previous charge cycle and a target rest voltage of the battery.

Figure 13:
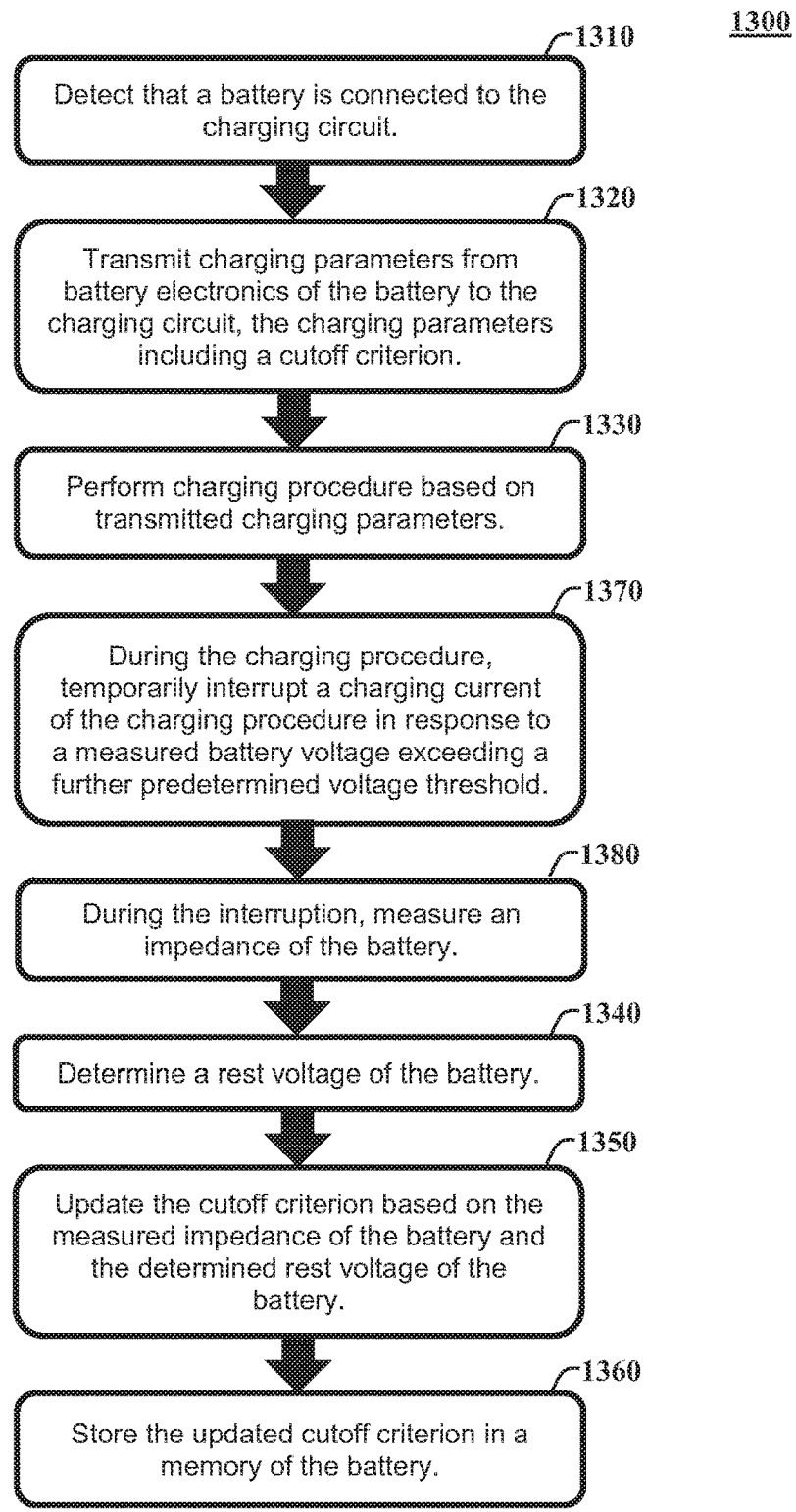
FIG. 13 shows a further method for adapting the charging procedure cutoff criterion over time as the battery ages.

In some embodiments, the charge controller 214 is configured to estimate the impedance of the battery 202 during the charging procedure using an equivalent circuit model and measured battery parameters, such as the charge current and the battery voltage. However, in some embodiments, the charging procedure can be temporarily interrupted to enable a more accurate measure of the impedance of the battery 202. Particularly, FIG. 13 shows a method 1300 for adapting cutoff criterion of the charging procedure over time as the battery ages that includes a current interrupt stage for measuring battery impedance. The method 1300 is similar to the method 1200, but includes some modifications to account for changes in battery impedance. The method 1300 begins when it is detected that a battery is connected to the charging circuit (block 1310). When a battery has been connected to the charging circuit, the method 1300 continues by transmitting charging parameters, which at least include a cutoff criterion, from battery electronics of the battery to the charging circuit (block 1320). The steps 1310, 1320 are essentially similar to the steps 1210, 1220 of the method 1200, and are not described again in complete detail.

After the charging circuit has received the charging parameters, the method 1300 continues with performing a charging procedure based on the received charging parameters (block 1330). Particularly, after receiving the charging parameters from the battery electronics 222 and/or the battery controller 224, the charge controller 214 is configured to operate the charging circuit 212 to perform a charging procedure for charging that battery 202 in accordance with the received charging parameters. In at least one embodiment, the charging procedure is one of the methods 300, 500, 800, and 1000 discussed above, and is ended upon satisfaction of the cutoff criterion received from the battery 202 prior to performing the charging procedure.

In contrast with the method 1200, during the charging procedure, the method 1300 includes temporarily interrupting a charging current of the charging procedure in response to a measured battery voltage exceeding a further predetermined voltage threshold (block 1370). Particularly, the charge controller 214 is configured to periodically or continuously compare the measured battery voltage from the voltage sensor 220 with an interrupt voltage threshold. In response to the measured battery voltage reaching the interrupt voltage threshold, the charge controller 214 is configured to operate the charging circuit 212 to temporarily interrupt the application of charging currents to the battery 202. During the interruption (which may also be referred to herein as the "current interrupt stage"), the charging circuit 212 is operated such that no charging current is applied to the battery 202. In response to a predetermined amount of time passing since the start of the interruption, the charge controller 214 is configured to operate the charging circuit 212 to resume applying charging currents according to the respective charging procedure being utilized. In one embodiment, the predetermined amount of time is 50 milliseconds or, in other words, the current interrupt stage lasts for 50 milliseconds.

The interrupt voltage threshold is distinct from the voltage limit discussed with respect to the methods 300, 500, 800, and 1000 that is used to end the constant current phase of the respective charging procedure, but the relationship between the two thresholds will determine which charging phase the current interrupt stage occurs in. In some embodiments, the interrupt voltage threshold may be equal to the voltage limit used to end the constant current phase of the respective charging procedure. In such embodiments, the current interrupt stage essentially occurs between the constant current (CC) phase, and the secondary phase of the respective charging procedure (e.g., the constant voltage rate (CdV) phase, the defined decreasing current (DDC) phase, the constant-current-rate (CdC) phase, the constant increased voltage (CV+) phase, or the constant decreased current (CDC) phase, as discussed above). In other embodiments, the interrupt voltage threshold may be less than the voltage limit used to end the constant current phase, such that the current interrupt stage occurs during the constant current phase. Finally, in some embodiments, the interrupt voltage threshold may be greater that the than the voltage limit used to end the constant current phase, such that the current interrupt stage occurs during the secondary charging phase. In at least one embodiment, the interrupt voltage threshold is equal to the manufacture specified steady state voltage limit, e.g. 4.2 volts.

The method 1300 continues with measuring an impedance of the battery during the temporary interruption of the charging current (block 1380). Particularly, during the current interrupt stage, the charge controller 214 and/or the battery controller 224 is configured to measure the impedance of the battery 202. In some embodiments, the impedance of the battery 202 is measured based on a battery voltage drop during the current interrupt stage. Particularly, in at least one embodiment, the charge controller 214 is configured to measure an impedance R of the battery 202 using the equation $R=t,?V_{threshold}-V_{\{t^+\}}/I_{charge}$, where $V_{threshold}$ is the interrupt voltage threshold or a measured voltage of the battery immediately before the current interrupt stage, $V_{\{t^+\}}$ is a measured voltage of the battery at the end of or immediately after the current interrupt stage, and $I_{charge}$ is a measured charging current immediately before the current interrupt stage. In one embodiment, in response to the measured battery voltage reaching the interrupt voltage threshold, the charge controller 214 is configured to operate the current sensor 218 to measure the charging current immediately before operating the charging circuit 212 to temporarily interrupt the application of charging currents to the battery 202. Similarly, in response to the predetermined amount of time passing since the start of the interruption, the charge controller 214 is configured to operate the voltage sensor 220 to measure the battery voltage immediately before or immediately after operating the charging circuit 212 to resume applying charging currents according to the respective charging procedure.

After the current interrupt stage occurs, the charging procedure is resumed and eventually ended based on the respective cutoff criterion being satisfied, as discussed above with respect to the methods 300, 500, 800, and 1000. After the charging procedure has concluded, the method 1300 continues by determining a rest voltage of the battery (block 1340). The step 1340 is essentially similar to the step 1240 of the method 1200 and is not described again in complete detail.

The method 1300 further includes updating the cutoff criterion based on the measured impedance of the battery and the determined rest voltage of the battery (block 1350). As discussed above, updating the cutoff criterion $I_{cutoff}$, $T_{cutoff}$, or $V_{cutoff}$ based merely on the rest voltage does not account for the variations in battery impedance as the battery 202 ages. Accordingly, the charge controller 214 is configured to update the respective cutoff criterion $I_{cutoff}$, $T_{cutoff}$, or $V_{cutoff}$ further based on the a difference between the measured impedance R of the battery 202 and an impedance R of the battery 202 measured in a previous charge cycle of the battery 202.

Particularly, in embodiments that utilize a cutoff current $I_{cutoff}$ as the cutoff criterion, such as the methods 300, 500, and 800, the charge controller 214 and/or the battery controller 224 is configured to adjust the cutoff current using an process that is based on: $I_{cutoff}(k)=I_{cutoff}(k-1)-K_1*(R(k)-R(k-1))+K_2*(V_{rest}(k-1)-V_{rest,target})$, where k is the current charge cycle, $I_{cutoff}(k)$ is the adjusted cutoff current, $I_{cutoff}(k-1)$ is the cutoff current for the previous charge cycle, $R(k)$ is the measured impedance of the battery 202 for the current charge cycle, $R(k-1)$ is the measured impedance of the battery 202 for the previous charge cycle, $V_{rest}(k-1)$ is the measured or estimated rest voltage after the previous charge cycle, $V_{rest,target}$ is the target rest voltage, and $K_1$ and $K_2$ are tunable proportional feedback gain parameters.

Similarly, in embodiments that utilize a cutoff timer $T_{cutoff}$ as a cutoff criterion, such as the method 1000, the charge controller 214 and/or the battery controller 224 is configured to adjust the cutoff timer using a control process that is based on: $T_{cutoff}(k)=T_{cutoff}(k-1)-K_1*(R(k)-R(k-1))-K_2*(V_{rest}(k-1)-V_{rest,target})$, where $T_{cutoff}(k)$ is the adjusted cutoff timer and $T_{cutoff}(k-1)$ is the cutoff timer for the previous charge cycle. Finally, in embodiments that utilize a cutoff voltage $V_{cutoff}$ as a cutoff criterion, the charge controller 214 and/or the battery controller 224 is configured to adjust the cutoff voltage using a control process that based on: $V_{cutoff}(k)=V_{cutoff}(k-1)-K_1*(R(k)-R(k-1))-K_2*(V_{rest}(k-1)-V_{rest,target})$, where $V_{cutoff}(k)$ is the adjusted cutoff voltage and $V_{cutoff}(k-1)$ is the cutoff voltage for the previous charge cycle.

In at least some embodiments, the charge controller 214 is configured to update the respective cutoff criterion after the current interrupt stage, but before the end of the secondary phase of the charging procedure. In such embodiments, the charge controller 214 is configured to use the updated cutoff criterion for determining when to end the secondary phase of the charging procedure. In this way, the method 1300 not only enables the cutoff criterion to be adjusted for changes in battery impedance as the battery 202 ages, but also enables compensation for variances due to particular conditions (e.g., ambient temperature) of the current charging cycle.

Finally, the method 1300 includes transmitting the updated cutoff criterion back to the battery if the cutoff criterion was updated by the charge controller, and storing the updated cutoff criterion in a memory of the battery (1360). The step 1360 is essentially similar to the step 1260 of the method 1200 and is not described again in complete detail.

Figure 14:
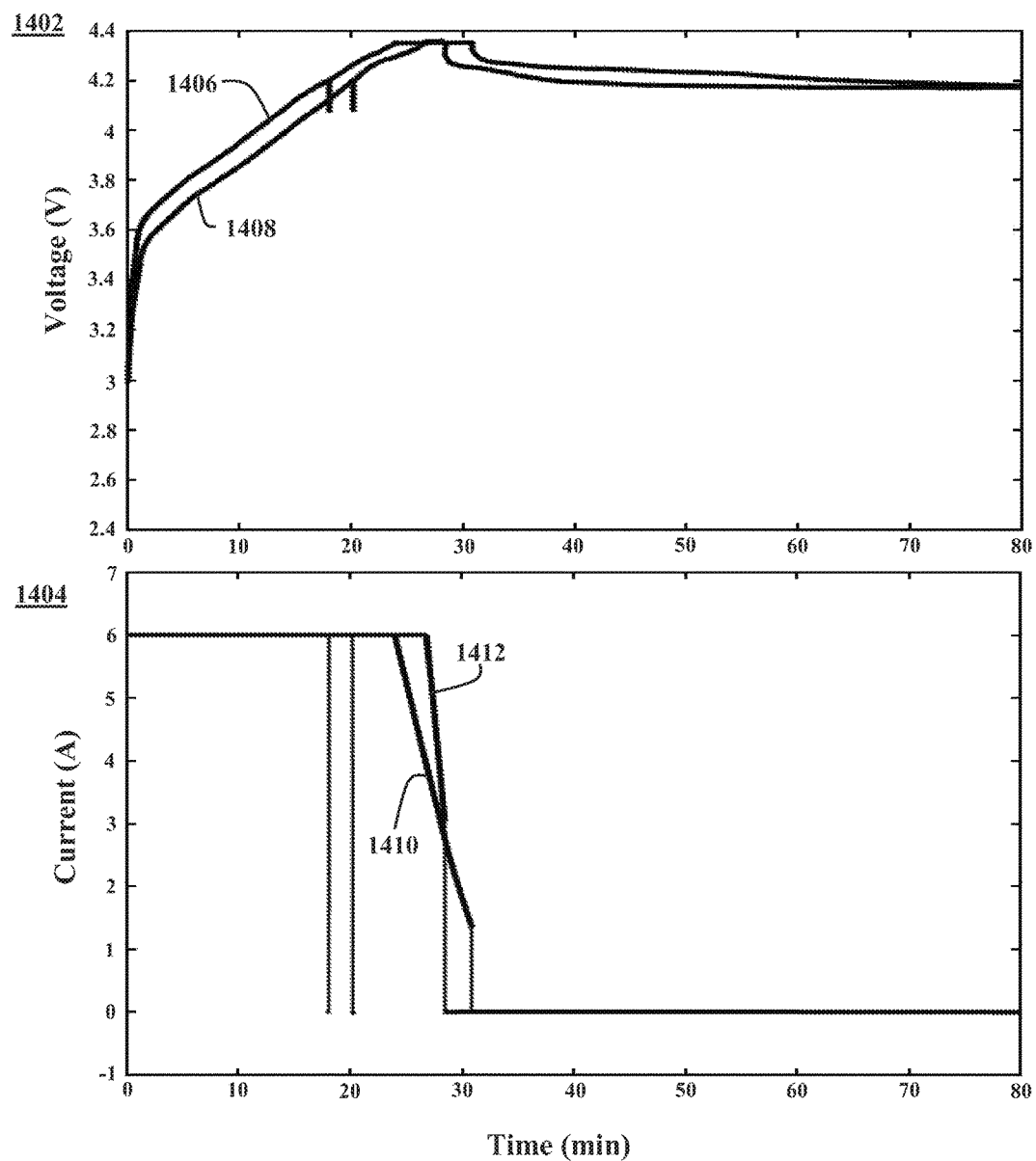
FIG. 14 shows simulation results for an extended constant-current constant-increased-voltage (CC-CV+) charging procedure having a current interrupt stage.

FIG. 14 shows simulation results for an extended constant-current constant-increased-voltage (CC-CV+) charging procedure having a current interrupt stage. Particularly, the plots 1402 and 1404 depict a CC-CV+ charging procedure in which the voltage limit for ending the extended constant-current phase is set to 4.35 Volts and the target constant battery voltage for the constant-increased-voltage is set to 4.35 Volts, both of which are greater than the steady state voltage limit of the battery, which is 4.2 Volts. Additionally, the interrupt voltage threshold is set equal to the steady state voltage limit at 4.2 Volts. The plot 1402 shows a battery voltage profile 1406 during a first cycle of the CC-CV+ charging procedure and a battery voltage profile 1408 during a second cycle of the CC-CV+ charging procedure. Similarly, the plot 1404 shows a charging current profile 1410 during the first cycle of the CC-CV+ charging procedure and a charging current profile 1412 during the second cycle of the CC-CV+ charging procedure. During the first cycle, the battery is charged with an ambient temperature of 15° C. In contrast, during the second cycle, the battery is charged with an ambient temperature of 35° C.

As can be seen in the plots 1402, during the extended constant current phase, the battery voltages 1406, 1408 reach the interrupt voltage threshold of 4.2 Volts at about 18 minutes and 21 minutes, respectively. In response to reaching 4.2 Volts, the charging currents 1410, 1412 are interrupted for about 50 milliseconds, as shown in the plot 1404. During the current interruption, a voltage drop occurs and the battery impedance is measured. After the current interruption, the charging currents 1410, 1412 resume and, in each case, the charge controller 214 updates the respective cutoff current $I_{cutoff}$ based on the measured battery impedance R, as discussed above. As shown in the plot 1404, the cutoff current $I_{cutoff}$ for the first charge cycle is set to about 1.3 amperes and the charging current 1410 reaches the cutoff current at about 32 minutes. However, due to the significant difference in ambient temperature during the second charge cycle, the cutoff current $I_{cutoff}$ for the second charge cycle is set to about 3.1 amperes and the charging current 1412 reaches the cutoff current at about 28 minutes.

As can be seen in the plots 1402 and 1404, a change in temperature results in significant change in the voltage behavior, battery impedance, and the chosen cutoff current. However, adapting the cutoff criteria to the change in impedance it is possible to relax to the target rest voltage after charging even when the battery operating condition has changed significantly.

It is noted that the steps of the methods 1200 and 1300 may be performed in any feasible chronological order, regardless of the order shown in the figures or the order in which the steps are described. Additionally, the methods 1200 and 1300 described here can not only be applied to the entire battery 202, but also can be applied to individual cells 204 of the battery 202. Particularly, in some embodiments, voltages and currents for the individual cells 204 are measured by corresponding sensors. In some embodiments, the charging parameters are updated based on the weakest cell 204 in the battery 202. The weakest cell could be changing even within the same charging cycle, e.g. $I(t+1)=\min(I(t)+p*(Vi(t)-ViT(t)))$, where $Vi(t)$ is individual cell voltage and $ViT(t)$ is the target voltage of cell i. In some embodiments, the voltage limits, cutoff currents, and other thresholds discusses herein are adjusted before, during, or after each charge cycle for each of the individual cells 204.

Figure 15:
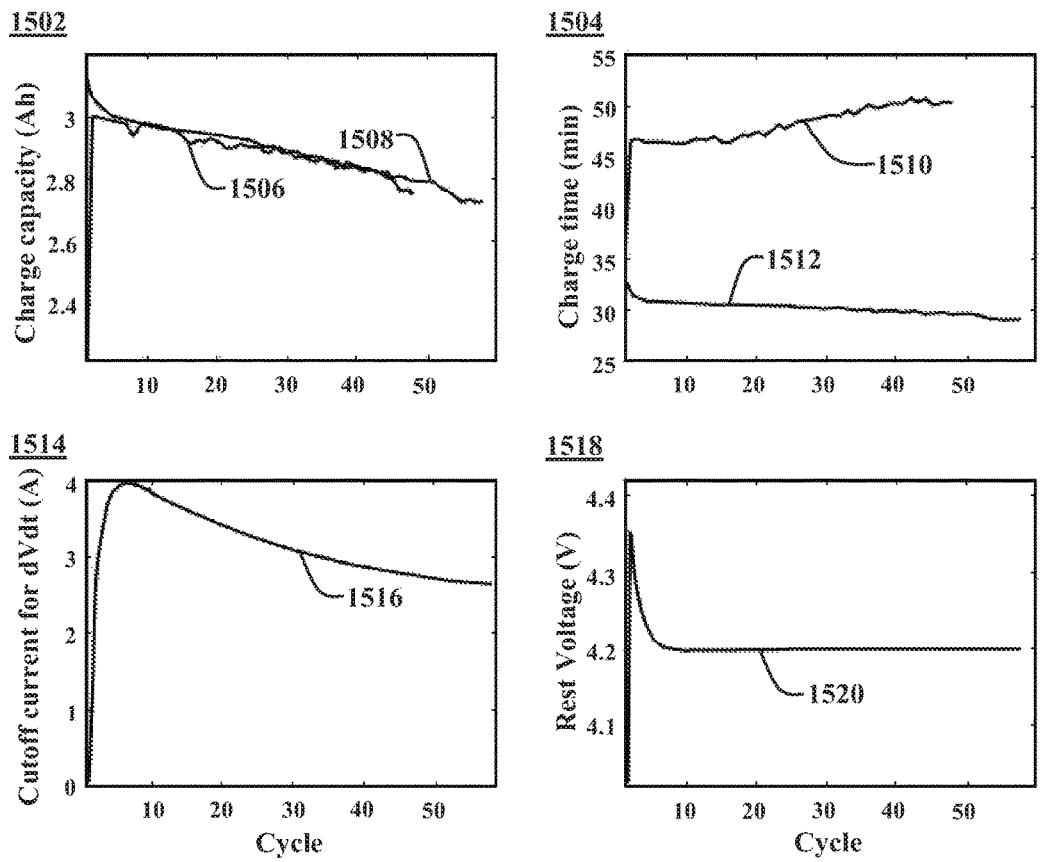
FIG. 15 shows experimental results comparing battery aging over many cycles using standard CCCV charging and CC-CdV charging with a voltage ramp of 20 mV/min.

FIG. 15 shows experimental results comparing battery aging over many cycles using standard CCCV charging and CC-CdV charging with $V_R=20$ mV/min. The plots 1502 and 1504 depict aging of the battery over 50+ charge cycles using a standard CCCV charging procedure compared with aging resulting from CC-CdV charging with $V_R=20$ mV/min. Particularly, the plot 1502 shows charge capacity profiles 1506 and 1508 corresponding to a standard CCCV charging procedure and CC-CdV charging with $V_R=20$ mV/min, respectively. Similarly, the plot 1504 shows charge time profiles 1510 and 1512 corresponding to a standard CCCV charging procedure and CC-CdV charging with $V_R=20$ mV/min, respectively. As can be seen in the plots 1502 and 1504, CC-CdV charging has substantially no negative impact on the aging of the battery (as seen by the rate of capacity degradation), as compared to a standard CCCV charging procedure, while also provided significantly reduced charging times. Additionally, the plot 1514 shows a profile 1516 for the cutoff current as it is adapted over 50+ charge cycles of the battery. Finally, the plot 1518 shows a profile 1520 for the rest voltage over 50+ charge cycles of the battery.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method for charging a battery, the method comprising:
   measuring a battery voltage of the battery with a voltage sensor and a battery current of the battery with a current sensor;
   applying, with a charging circuit, a first charging current to the battery until the measured battery voltage exceeds a predetermined voltage threshold, a magnitude of the first charging current being held at a first constant value;
   applying, with the charging circuit, in response to the measured battery voltage exceeding the predetermined voltage threshold, a second charging current to the battery until a cutoff criterion is satisfied, a magnitude of the second charging current being such that the measured battery voltage exceeds a steady state voltage limit for the battery;
   determining an impedance of the battery;
   after the cutoff criterion is satisfied, determining a rest voltage of the battery; and
   updating the cutoff criterion based on (i) a difference between the determined rest voltage of the battery and a target rest voltage of the battery and (ii) a difference between the impedance of the battery determined in a current charge cycle and an impedance of the battery determined in a previous charge cycle of the battery.

2. The method of claim 1, the applying of the second charging current further comprising:
   varying the magnitude of the second charging current in response to difference between the measured battery voltage and a target monotonically increasing battery voltage.

3. The method of claim 1, the applying of the second charging current further comprising:
   varying the magnitude of the second charging current in response to a difference between the measured battery current and a target monotonically decreasing battery current.

4. The method of claim 1, the applying of the second charging current further comprising:
   varying the magnitude of the second charging current in response to difference between the measured battery voltage and a target constant battery voltage, the target constant battery voltage being greater than the steady state voltage limit for the battery,
   wherein the predetermined voltage threshold is greater than the steady state voltage limit for the battery.

5. The method of claim 1, the applying of the second charging current further comprising:
   holding the magnitude of second charging current at a second constant value that is less than the first constant value.

6. The method of claim 1, the applying of the second charging current until the cutoff criterion is satisfied further comprising:
   comparing a measured current with a predetermined current threshold; and
   ceasing the application of the second charging current in response to the measured current falling below the predetermined current threshold.

7. The method of claim 1, the applying of the second charging current until the cutoff criterion is satisfied further comprising:
   comparing an amount of time since a start of the application of the second charging current with a predetermined threshold amount of time; and
   ceasing the application of the second charging current in response to the amount of time since the start of the application of the second charging current exceeding the predetermined threshold amount of time.

8. The method of claim 1 further comprising:
   receiving, with the charging circuit, before the applying of the first charging current, the cutoff criterion from battery electronics of the battery; and
   storing, after updating the cutoff criterion, the updated cutoff criterion on a memory of the battery.

9. The method of claim 1, the determining of the impedance of battery further comprising:
   temporarily interrupting one of (i) the applying of the first charging current and (ii) the applying of the second charge current in response to the measured battery voltage exceeding a further predetermined voltage threshold, zero charging current being applied to battery during the interruption, the interruption lasting a predetermined amount of time before resuming the one of (i) the applying of the first charging current and (ii) the applying of the second charge current; and
   measuring the impedance of the battery during the interruption of the one of (i) the applying of the first charging current and (ii) the applying of the second charge current.

10. A charging system for charging a battery, the charging system comprising:
    a charging circuit configured to connect to a power source and to the battery, the charging circuit configured to draw current from the power source to apply charging currents to the battery;
    a voltage sensor configured to measure a battery voltage of the battery;
    a current sensor configured to measure a battery current of the battery; and
    a charge controller operably connected to the charging circuit, the voltage sensor, and the current sensor, the charge controller configured to:
      operate the voltage sensor to measure a battery voltage of the battery and operate the current sensor to measure a battery current of the battery;
      operate the charging circuit to apply a first charging current to the battery until the measured battery voltage exceeds a predetermined voltage threshold, a magnitude of the first charging current being held at a first constant value; and
      operate the charging circuit to apply, in response to the measured battery voltage exceeding the predetermined voltage threshold, a second charging current to the battery until a cutoff criterion is satisfied, a magnitude of the second charging current being such that the measured battery voltage exceeds a steady state voltage limit for the battery,
    wherein at least one of the charge controller and a battery controller of the battery is configured to:
      determine an impedance of the battery;
      after the cutoff criterion is satisfied, determine a rest voltage of the battery; and
      update the cutoff criterion based on (i) a difference between the determined rest voltage of the battery and a target rest voltage of the battery and (ii) a difference between the impedance of the battery determined in a current charge cycle and an impedance of the battery determined in a previous charge cycle of the battery.

11. The charging system of claim 10, the charge controller further configured to:
operate the charging circuit to vary the magnitude of the second charging current in response to difference between the measured battery voltage and a target monotonically increasing battery voltage.

12. The charging system of claim 10, the charge controller further configured to:
operate the charging circuit to vary the magnitude of the second charging current in response to a difference between the measured battery current and a target monotonically decreasing battery current.

13. The charging system of claim 10, the charge controller further configured to:
operate the charging circuit to vary the magnitude of the second charging current in response to difference between the measured battery voltage and a target constant battery voltage, the target constant battery voltage being greater than the steady state voltage limit for the battery,
wherein the predetermined voltage threshold is greater than the steady state voltage limit for the battery.

14. The charging system of claim 10, the charge controller further configured to:
operate the charging circuit to hold the magnitude of second charging current at a second constant value that is less than the first constant value.

15. The charging system of claim 10, the charge controller further configured to:
compare a measured current with a predetermined current threshold; and
operate the charging circuit to cease the application of the second charging current in response to the measured current falling below the predetermined current threshold.

16. The charging system of claim 10, the charge controller further configured to:
compare an amount of time since a start of the application of the second charging current with a predetermined threshold amount of time; and
operate the charging circuit to cease the application of the second charging current in response to the amount of time since the start of the application of the second charging current exceeding the predetermined threshold amount of time.

17. The charging system of claim 10, wherein:
the charge controller further configured to, before operating the charging circuit to apply the first charging current, receive the cutoff criterion from battery electronics of the battery; and
battery controller of the battery is configured to, after the cutoff criterion is updated, store the updated cutoff criterion on a memory of the battery.

18. The charging system of claim 10, wherein:
the charge controller is configured to operate the charging circuit to temporarily interrupt one of (i) the application of the first charging current and (ii) the application of the second charge current in response to the measured battery voltage exceeding a further predetermined voltage threshold, the charging circuit is operated to apply zero charging current to battery during the interruption, the interruption lasting a predetermined amount of time before the charging circuit is operated to resume the one of (i) the application of the first charging current and (ii) the application of the second charge current; and
at least one of the charge controller and the battery controller is configured to measure the impedance of the battery during the interruption of the one of (i) the application of the first charging current and (ii) the application of the second charge current.

* * * * *